(12) United States Patent
Lee et al.

(10) Patent No.: US 9,755,085 B2
(45) Date of Patent: Sep. 5, 2017

(54) SEMICONDUCTOR DEVICE AND METHOD OF MANUFACTURING THE SAME

(75) Inventors: Ki Hong Lee, Suwon-si (KR); Seung Ho Pyi, Seongnam-si (KR); Jung Yun Chang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 402 days.

(21) Appl. No.: 13/537,650

(22) Filed: Jun. 29, 2012

(65) Prior Publication Data

US 2013/0009229 A1    Jan. 10, 2013

(30) Foreign Application Priority Data

Jul. 8, 2011 (KR) .................. 10-2011-0067772
Mar. 2, 2012 (KR) .................. 10-2012-0021781

(51) Int. Cl.

| | |
|---|---|
| *H01L 27/088* | (2006.01) |
| *H01L 21/8239* | (2006.01) |
| *H01L 29/792* | (2006.01) |
| *H01L 29/66* | (2006.01) |
| *H01L 27/11582* | (2017.01) |

(52) U.S. Cl.
CPC .... *H01L 29/7926* (2013.01); *H01L 27/11582* (2013.01); *H01L 29/66833* (2013.01)

(58) Field of Classification Search
CPC .......... H01L 27/11582; H01L 29/7827; H01L 27/1158; H01L 27/1556
See application file for complete search history.

(56) References Cited

U.S. PATENT DOCUMENTS

| | | |
|---|---|---|
| 2010/0178755 A1 | 7/2010 | Lee et al. |
| 2010/0207190 A1 | 8/2010 | Katsumata et al. |
| 2010/0213538 A1* | 8/2010 | Fukuzumi et al. ........... 257/326 |
| 2010/0224928 A1 | 9/2010 | Fukuzumi et al. |
| 2010/0237400 A1 | 9/2010 | Aoyama |
| 2011/0014780 A1 | 1/2011 | Shimomura et al. |
| 2011/0057250 A1* | 3/2011 | Higashi ......................... 257/324 |
| 2011/0057251 A1 | 3/2011 | Higashi |
| 2011/0062510 A1* | 3/2011 | Joo ................................ 257/324 |
| 2011/0065270 A1* | 3/2011 | Shim et al. .................... 438/589 |
| 2011/0090737 A1* | 4/2011 | Yoo ..................... G11C 16/0483 365/185.11 |
| 2011/0147801 A1 | 6/2011 | Shim et al. |
| 2011/0180866 A1* | 7/2011 | Matsuda ........... H01L 27/11573 257/324 |

(Continued)

FOREIGN PATENT DOCUMENTS

| | | |
|---|---|---|
| CN | 1725494 A | 1/2006 |
| JP | 2010192531 A | 9/2010 |

(Continued)

*Primary Examiner* — Kimberly Rizkallah
*Assistant Examiner* — Mounir Amer
(74) *Attorney, Agent, or Firm* — William Park & Associates Ltd.

(57) ABSTRACT

A semiconductor device includes memory blocks each configured to comprise a pair of channels, each channel including a pipe channel formed in a pipe gate of the memory block and a drain-side channel and a source-side channel coupled to the pipe channel; first slits placed between the memory blocks adjacent to other memory blocks; and a second slit placed between the source-side channel and the drain-side channel of each pair of channels.

26 Claims, 43 Drawing Sheets

(56) References Cited

U.S. PATENT DOCUMENTS

| | | | |
|---|---|---|---|
| 2011/0216604 A1* | 9/2011 | Mikajiri | G11C 16/04 365/185.26 |
| 2011/0235421 A1* | 9/2011 | Itagaki et al. | 365/185.17 |
| 2012/0001250 A1* | 1/2012 | Alsmeier | 257/319 |
| 2013/0130468 A1* | 5/2013 | Higashitani et al. | 438/382 |

FOREIGN PATENT DOCUMENTS

| | | |
|---|---|---|
| JP | 2010205904 A | 9/2010 |
| JP | 2010219409 A | 9/2010 |
| JP | 2011054899 A | 3/2011 |
| JP | 2011060838 A | 3/2011 |
| JP | 2011198435 A | 10/2011 |
| JP | 2012094694 A | 5/2012 |
| WO | 2010035609 A1 | 4/2010 |

\* cited by examiner

US 9,755,085 B2

SEMICONDUCTOR DEVICE AND METHOD OF MANUFACTURING THE SAME

CROSS-REFERENCE TO RELATED APPLICATIONS

This application claims priority to Korean patent application numbers 10-2011-0067772, filed on Jul. 8, 2011, and 10-2012-0021781, filed on Mar. 2, 2012, the entire disclosures of which are incorporated herein by reference in their entirety.

BACKGROUND

Exemplary embodiments relate to a semiconductor device and a method of manufacturing the same and, more particularly, to a 3-Dimensional (3-D) non-volatile memory device and a method of manufacturing the same.

A non-volatile memory device retains data although the supply of power has been terminated. As the degree of integration in creating 2-D memory devices in which memory cells are fabricated on a silicon substrate in the form of a single layer reaches a limit, there are proposals of 3-D non-volatile memory devices in which memory cells are vertically stacked on silicon substrates.

The 3-D non-volatile memory device includes stack structures, in each of which multiple layers of word lines are stacked in order to stack memory cells. In this case, there is a problem in that the stack structures lean or collapse in a process of manufacturing the memory device.

BRIEF SUMMARY

Various embodiments relate to a semiconductor device and a method of manufacturing the same, which are suitable for preventing stack structures from leaning or collapsing. A semiconductor device according to an aspect of the present disclosure includes memory blocks each configured to comprise a pair of channels, each channel including a pipe channel formed in a pipe gate of the memory block and a drain-side channel and a source-side channel coupled to the pipe channel; first slits placed between the memory blocks adjacent to other memory blocks; and a second slit placed between the source-side channel and the drain-side channel of each pair of channels.

A semiconductor device according to another aspect of the present disclosure includes memory blocks each configured to include channels protruded from a substrate, at least one first slit placed in the slimming region of the memory block, at least one second slit placed between the channels, and third slits placed between the memory blocks adjacent to each other.

A method of manufacturing a semiconductor device according to an aspect of the present disclosure includes alternately forming first material layers and second material layers substantially over each pipe gate; forming channels, each including a pipe channel formed in the pipe gate and a pair of a drain-side channels and source-side channels formed to substantially penetrate the first material layers and the second material layers and coupled to the pipe channel; etching the first material layers and the second material layers to form first slits placed between memory blocks adjacent to each other; filling a first insulating layer into the first slits; etching the first material layers and the second material layers to form second slits placed between a pair of the source-side channels and the drain-side channels; recessing the second material layers exposed to the second slits; and filling an interlayer insulating layer or a conductive layer in the recessed regions of the second material layers.

A method of manufacturing a semiconductor device according to another aspect of the present disclosure includes alternately forming first material layers and second material layers substantially over a substrate; forming channels protruding from the substrate and formed to substantially penetrate the first material layers and the second material layers; etching the first material layers and the second material layers to form at least one first slit placed in the slimming region of each of memory blocks; filling a first insulating layer into the first slit; etching the first material layers and the second material layers to form at least one second slit placed between the channels; recessing the second material layers exposed to the second slit; and filling an interlayer insulating layer or a conductive layer in the recessed regions of the second material layers.

DESCRIPTION OF EMBODIMENTS

Figure 1:
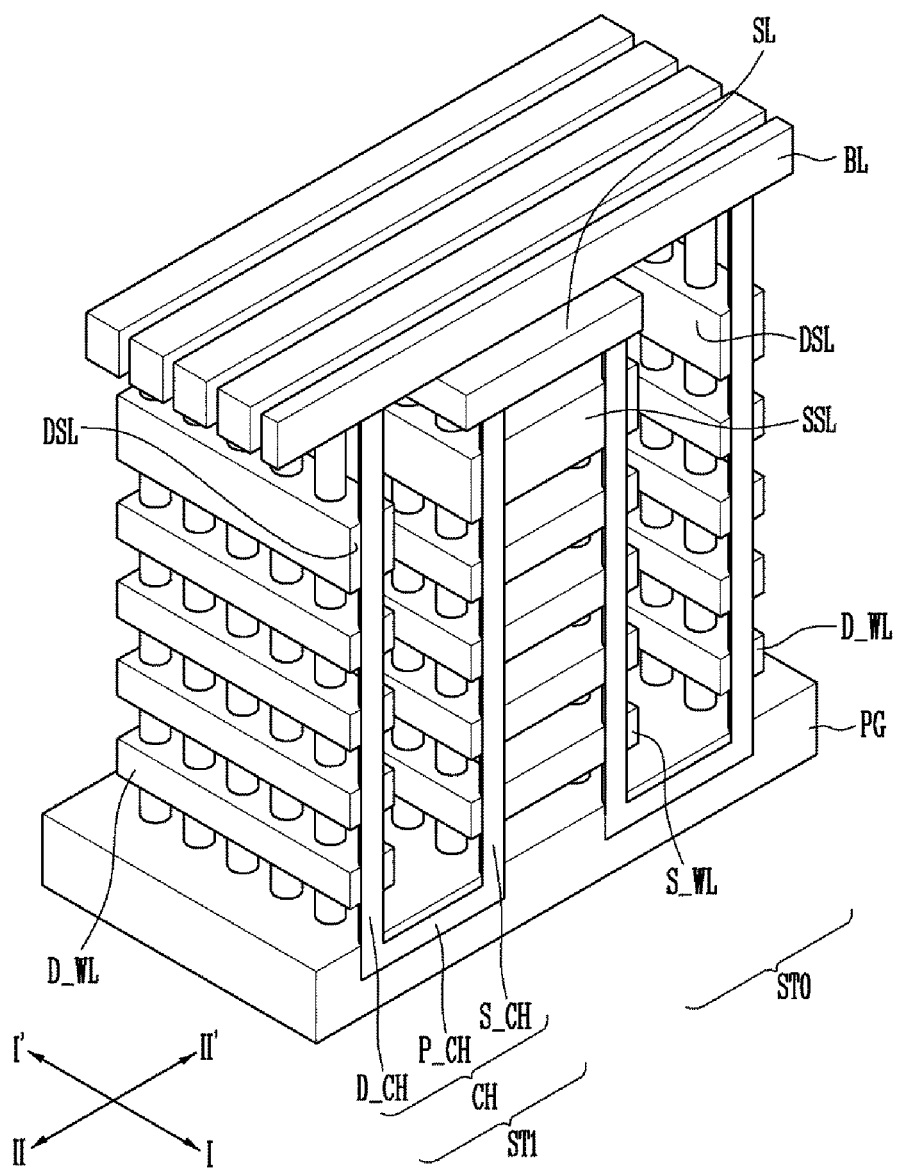
FIG. 1 is a perspective view of a 3-D non-volatile memory device according to first to fifth embodiments of this disclosure.

Hereinafter, some various embodiments of the present disclosure will be described in detail with reference to the accompanying drawings. The figures are provided to allow those having ordinary skill in the art to understand the scope of the embodiments of the disclosure. However, it should be noted that the spirit of the present invention is not limited to the embodiments set forth herein and that those skilled in the art and understanding the present invention could easily accomplish retrogressive inventions or other embodiments included in the spirit of the present invention by the addition, modification, and removal of components within the same spirit, but those are to be construed as being included in the spirit of the present invention.

In addition, like or similar reference numerals denote parts performing similar functions and actions throughout the drawings.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a perspective view of a 3-D non-volatile memory device according to first to fifth embodiments of this disclosure. It is to be noted that interlayer insulating or conductive layers are not shown in FIG. 1, for convenience of description, and only two strings ST1 and ST0 and elements related to the two strings are shown in FIG. 1, for simplicity.

The structure of the 3-D non-volatile memory device in which strings ST1 and ST0 are arranged in a U form and a method of manufacturing the 3-D non-volatile memory device are described in connection with the first to fifth embodiments.

As shown in FIG. 1, the 3-D non-volatile memory device according to the first to fifth embodiments of this disclosure includes a channel CH, comprising of a pipe channel P_CH formed in a pipe gate PG, and a source-side channel S_CH coupled with a drain-side channel D_CH via the pipe channel P_CH. The source-side channels S_CH of the strings ST0 and ST1 adjacent to each other in a second direction II-II' are coupled to one source line SL. The drain-side channels D_CH of the strings ST0 and ST1 adjacent to the source-side channels S_CH in the second direction II-II' are coupled to one bit line BL.

The 3-D non-volatile memory device further includes source-side word lines S_WL stacked in multiple layers and formed to generally surround the source-side channel S_CH and drain-side word lines D_WL stacked in multiple layers and formed to generally surround the drain-side channel D_CH. The source-side word lines S_WL and the drain-side word lines D_WL are separated from each other by a slit placed between a source-side channel S_CH and a drain-side channel D_CH.

A source select line SSL is placed over the source-side word lines S_WL, and a drain select line DSL are placed over the drain-side word lines D_WL.

The source-side word lines S_WL, the source select line SSL, the drain-side word lines D_WL, and the drain select line DSL of the strings ST0 and ST1 adjacent to each other in the second direction II-II' may be coupled or may be separated from each other by slits.

FIG. 1 shows an example in which the source-side word line S_WL and the source select line SSL of the strings ST0 and ST1 adjacent to each other in the second direction II-II' are coupled and the drain-side word line D_WL and the drain select line DSL of the strings ST0 and ST1 adjacent to each other in the second direction II-II' are separated from each other by a slit.

In addition, the drain-side word line D_WL and the drain select line DSL of the strings ST0 and ST1 adjacent to each other in the second direction II-II' may be coupled, and the source-side word line S_WL and the source select line SSL of the strings ST0 and ST1 adjacent to each other in the second direction II-II' may be separated from each other by a slit.

In some embodiments, if a slit placed between the drain-side channels D_CH adjacent to each other or the source-side channels S_CH adjacent to each other is formed to have the same depth as the select line SL, the source-side word line S_WL or the drain-side word line D_WL of the strings ST0 and ST1 adjacent to each other in the second direction II-II' may be coupled, but the source select line SSL or the drain select line DSL of the strings ST0 and ST1 adjacent to each other in the second direction II-II' may be separated from each other.

Figure 2:
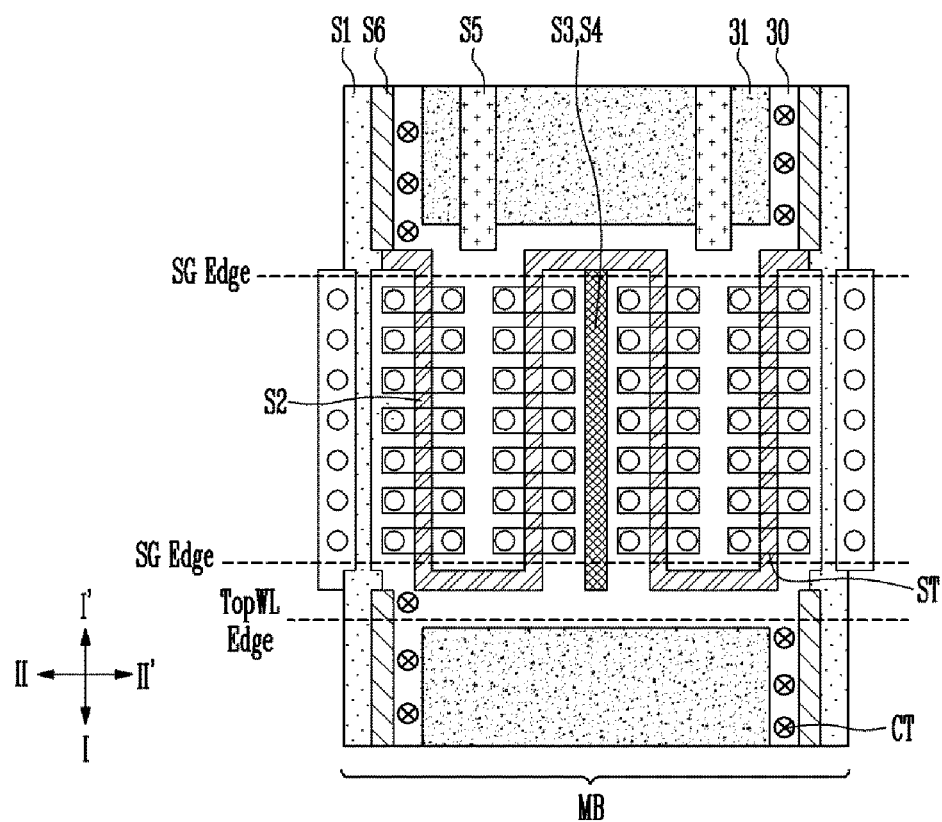
FIG. 2 is a layout diagram of the 3-D non-volatile memory device according to the first to fifth embodiments of this disclosure.

FIG. 2 is a layout diagram of the 3-D non-volatile memory device according the first to fifth embodiments of this disclosure. FIG. 2 is the layout diagram of the 3-D non-volatile memory device of FIG. 1.

In FIG. 2, reference numeral '30' denotes a region where interlayer insulating layers and conductive layers are alternately stacked, and reference numeral '31' denotes a region where interlayer insulating layers and sacrificial layers are alternately deposited. Furthermore, a symbol 'ST' denotes a string, and a symbol 'CT' denotes a contact plug coupled to a contact pad.

As shown in FIG. 2, the 3-D non-volatile memory device according the first to fifth embodiments of this disclosure includes at least two of first to sixth slits S1 to S6 and may use various combinations of the first to sixth slits S1 to S6. In particular, in this disclosure, after an insulating layer is filled in primary slits formed by a primary slit formation process, a secondary slit formation process is performed. Accordingly, whether any one of the first to sixth slits S1 to S6 will be formed first and any one of the first to sixth slits S1 to S6 will be formed secondly may be changed in various ways. In the process of forming the slits, one slit may be formed, or two or more slits may be formed at the same time or substantially the same time.

The first slit S1 is placed between memory blocks MB adjacent to other memory blocks and are configured to separate the adjacent memory blocks from each other. Here, each memory block MB includes a cell region configured to have strings arranged therein, slimming regions disposed at upper and lower sides of the cell region, and configured to have contact pads arranged therein. Accordingly, the first slit S1 may be formed to have a sufficient length so that it is placed between the cell regions and the slimming regions of the memory blocks MB adjacent to each other. Accordingly, the drain select lines DSL placed at the boundaries of the adjacent memory blocks MB are separated from other drain select lines DSL by the first slit S1. Since the first slit S1 is included in the memory device, the drain select lines DSL placed at the boundaries of the adjacent memory blocks MB can be individually driven. Thus, memory cells can be easily driven for every memory block MB.

The second slit S2 is placed between the pair of a source-side channel S_CH and a drain-side channel D_CH and are configured to separate the source-side word lines S_WL and the drain-side word lines D_WL from each other. The second slit S2 may be a plurality of linear slits extended generally in parallel to in a first direction I-I'. In some embodiments, a second slit S2 of generally a zigzag form, such as that shown in FIG. 4C, may be formed by coupling the plurality of linear slits at the circumference of a slimming region.

The third slit S3 may be placed between the drain-side channels D_CH adjacent to each other or the source-side channels S_CH adjacent to each other. If the third slit S3 is placed between the adjacent drain-side channels D_CH, the drain-side word line D_WL and the drain select line DSL of the strings adjacent to each other in the second direction II-II' are separated from each other. If the third slit S3 is placed between the adjacent source-side channels S_CH, the source-side word line S_WL and the source select line SSL of the strings adjacent to each other in the second direction II-II' are separated from each other.

The fourth slit S4 is placed between adjacent drain-side channels D_CH or between adjacent source-side channels S_CH and is formed to a depth to such an extent that only the select lines DSL and SSL are separated from each other. Thus, only the select lines DSL and SSL of the strings adjacent to each other in the second direction II-II' are separated from each other, and the word lines D_WL and S_WL of the adjacent strings are coupled.

The fifth slit S5 may be placed within the slimming region, in the circumference of the slimming region, or within the slimming region and in the circumference of the slimming region. Furthermore, the fifth slit S5 may be formed in a line form or may be formed in a line form having a projecting part. In general, one memory block MB includes an upper slimming region and a lower slimming region. The fifth slit S5 may be formed in both the upper and lower slimming regions or may be formed in one of the upper or lower slimming regions.

The fifth slit S5 may be formed in the primary slit formation process or may be formed in the secondary slit formation process. For example, if the fifth slit S5 is formed in the primary slit formation process, the interlayer insulating layers formed in the slimming region can be prevented from collapsing in a process of recessing the sacrificial layers. If the fifth slit S5 is formed in the secondary slit formation process, the contact pad may be formed within the slimming region.

If the fifth slit S5 is formed in a line form, the fifth slit S5 is placed not to overlap with the select line (DSL or SSL) region (see 'SG Edge').

The sixth slit S6 is placed between the first slit S1 and the slimming region. If the sixth slit S6 is formed in the secondary slit formation process, the contact pads may be formed at edges on both sides of the slimming region as shown in FIG. 2.

Figure 3:
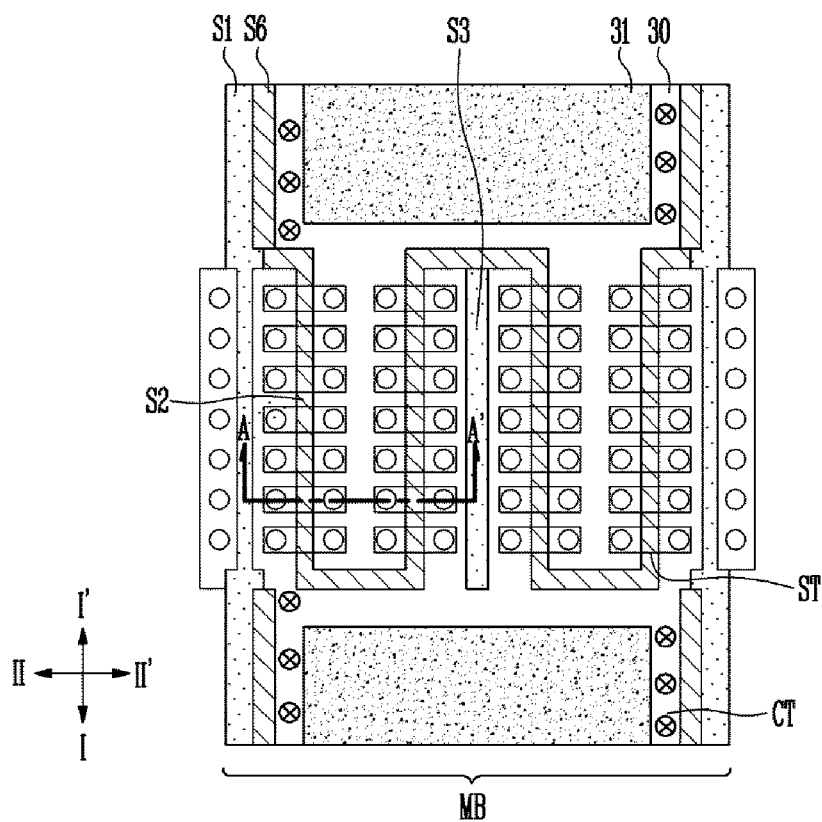
FIG. 3 is a layout diagram of a 3-D non-volatile memory device according to the first embodiment of this disclosure.

FIG. 3 is a layout diagram of a 3-D non-volatile memory device according to the first embodiment of this disclosure.

As shown in FIG. 3, the 3-D non-volatile memory device according to the first embodiment of this disclosure includes a plurality of the first slits S1 placed between the adjacent memory blocks, a plurality of the second slits S2 placed between a pair of the source-side channel S_CH and the drain-side channel D_CH, a plurality of the third slits S3 placed between the adjacent drain-side channels D_CH, and a plurality of the sixth slits S6 placed between the first slit S1 and the slimming region.

In this structure, the drain select lines DSL formed at the boundary of the adjacent memory blocks may be separated from each other by the first slit S1. The drain-side word line D_WL and the drain select line DSL of strings adjacent to each other in the second direction II-II' may be separated from each other with the third slit S3 interposed therebetween. The contact pads may be formed at the edges on both sides of the slimming region via the sixth slits S6.

FIGS. 4A to 4F are cross-sectional views illustrating a method of manufacturing the 3-D non-volatile memory device according to the first embodiment of this disclosure. FIGS. 4A to 4F show the cross-sectional views of the 3-D non-volatile memory device taken along line A-A' of FIG. 3.

Figure 4A:
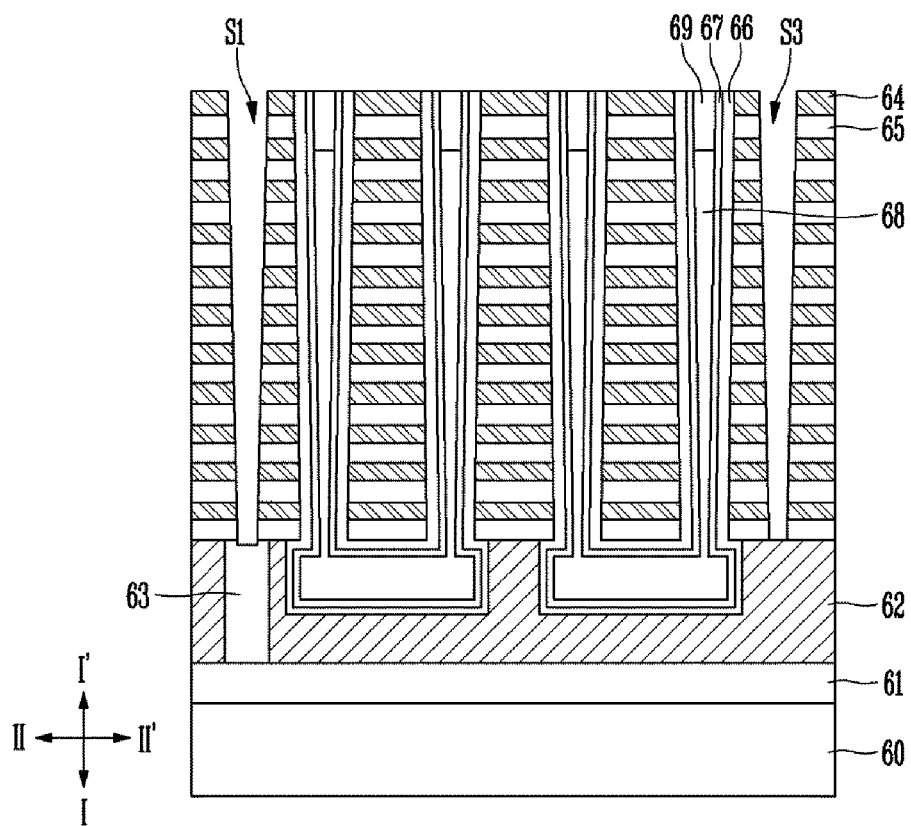
FIGS. 4A to 4F are cross-sectional views illustrating a method of manufacturing the 3-D non-volatile memory device according to the first embodiment of this disclosure.

As shown in FIG. 4A, a first interlayer insulating layer 61 and a conductive layer for pipe gates are formed over a substrate 60. The conductive layer for the pipe gates is etched to form the pipe gates 62. The pipe gates 62 of the adjacent memory blocks MB are separated from each other by filling an insulating layer 63 in the regions from which the conductive layer for the pipe gates has been etched.

After forming trenches by etching the pipe gate 62, a sacrificial layer (not shown) is filled in the trenches.

A capping layer (not shown) may be formed on the pipe gate 62 in which the sacrificial layer is filled. The capping layer may be used as an etch-stop layer in a subsequent process of forming slits. If the capping layer is comprised of a conductive layer, cell current flowing through a pipe channel can be improved as compared with the case where only the pipe gate 62 is formed.

First material layers 64 and second material layers 65 are alternately formed over the pipe gate 62 in which the sacrificial layer has been filled. The number of first material layers 64 and second material layers 65 is determined by the number of memory cells to be stacked.

The first material layers 64 are used to form word lines or select lines. The second material layers 65 are used to separate the stacked word lines and the stacked select lines from each other.

Each of the first material layers 64 and the second material layers 65 are made of material having a high etch selectivity. For example, the first material layer 64 may be comprised of a conductive layer, such as a polysilicon layer, and the second material layer 65 may be comprised of an insulating layer, such as an oxide layer. The first material layer 64 may be comprised of a conductive layer, such as a doped polysilicon layer or a doped amorphous silicon layer, and the second material layer 65 may be comprised of a sacrificial layer, such as an undoped polysilicon layer or an undoped amorphous silicon layer. The first material layer 64 may be comprised of a sacrificial layer, such as a nitride layer, and the second material layer 65 may be comprised of an insulating layer, such as an oxide layer.

In the first embodiment, it is assumed that the first material layer 64 is comprised of the sacrificial layer and the second material layer 65 is comprised of the interlayer insulating layer.

The first material layers 64 and the second material layers 65 are etched to form pairs of channel holes coupled to the trenches.

The first sacrificial layer exposed at the bottom of the pairs of channel holes is removed. A charge blocking layer, a memory layer, and a tunnel insulating layer (hereinafter collectively denoted by 66) are sequentially formed over the insides of the trenches and the pairs of channel holes. The pipe channel P_CH is formed in each of the trenches and the source-side channel S_CH and the drain-side channel D_CH are formed in each of the pairs of channel holes, by forming a channel layer 67 on the tunnel insulating layer.

The pipe channel P_CH, the source-side channel S_CH, and the drain-side channel D_CH may have a structure in which they are fully filled in the trench or a structure in which a central region is opened. In the present embodiment, the pipe channel P_CH, the source-side channel S_CH, and the drain-side channel D_CH are illustrated as having the structure in which the central region is opened. In this case, an insulating layer 68 is filled in the opened central region. After recessing the insulating layer 68 to a specific depth, conductive plugs 69 may be filled in the recessed regions.

Next, the first material layers 64 and the second material layers 65 are etched to form the plurality of first slits S1 placed between the adjacent memory blocks MB. When forming the first slits S1, the plurality of third slits S3 placed between the adjacent drain-side channels D_CH may be formed.

The pipe gate 62 exists at the bottom of the third slit S3, and the insulating layer 63 is filled under the first slit S1. When forming the third slit S3, the pipe gate 62 may play a role of an etch-stop layer, but the insulating layer 63 does not play the role of the etch-stop layer. Thus, the first slit S1 may be formed deeper than the third slit S3.

Figure 4B:
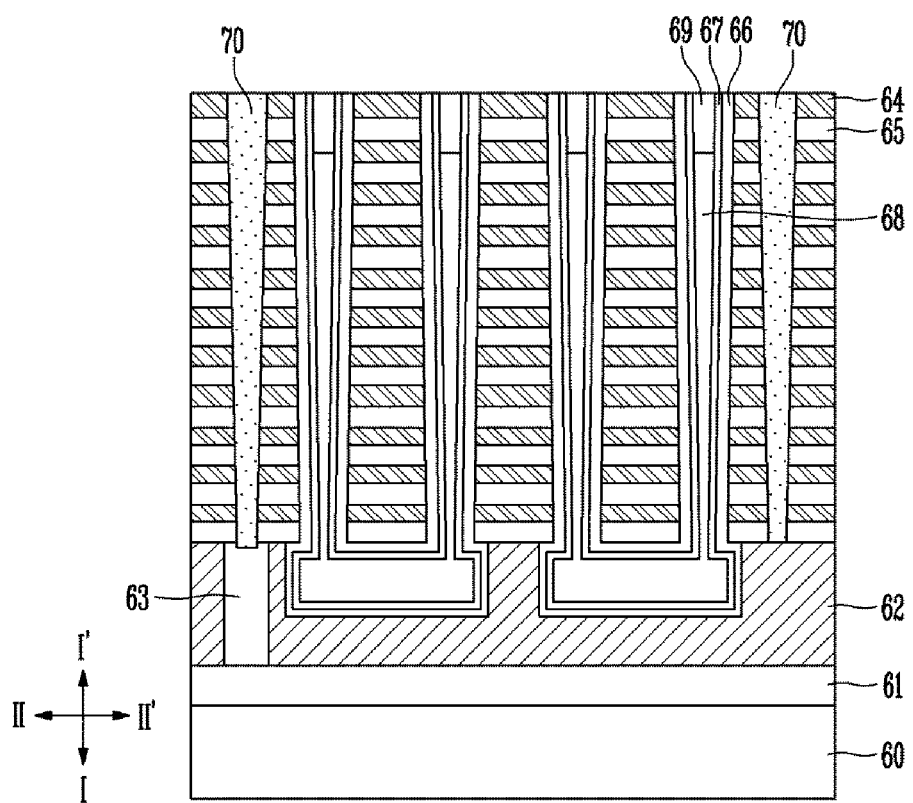

As shown in FIG. 4B, an insulating layer 70 is filled in the plurality of first slits S1 and the plurality of third slits S3. The insulating layer 70 may be formed of an oxide layer.

Figure 4C:
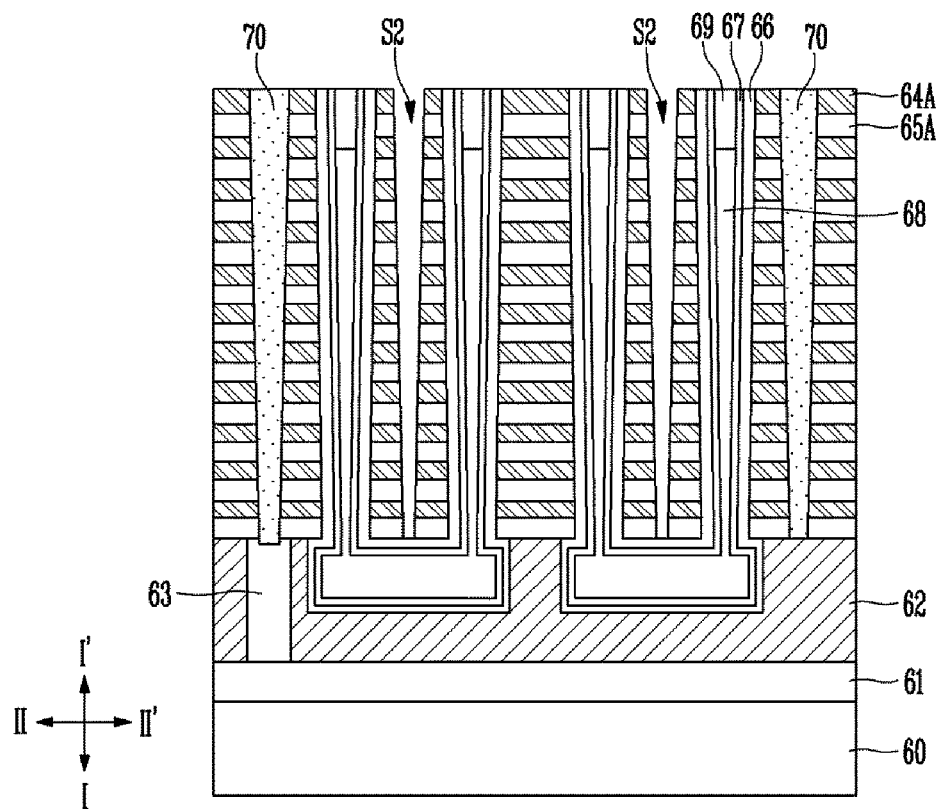

As shown in FIG. 4C, the first material layers 64 and the second material layers 65 are etched to form the plurality of second slits S2 placed between a source-side channel S_CH and a drain-side channel D_CH within each pair. Although not shown, when forming the plurality of second slits S2, the plurality of sixth slits S6 placed between the first slit S1 and the slimming region may also be formed. The second slit S2 and the sixth slit S6 may be formed to a depth by which the first material layers 64 are fully exposed.

In FIG. 4C, the first material layers and the second material layers, etched when forming the second slit S2 and the sixth slit S6, are denoted by reference numeral '64A' and reference numeral '65A', respectively.

Figure 4D:
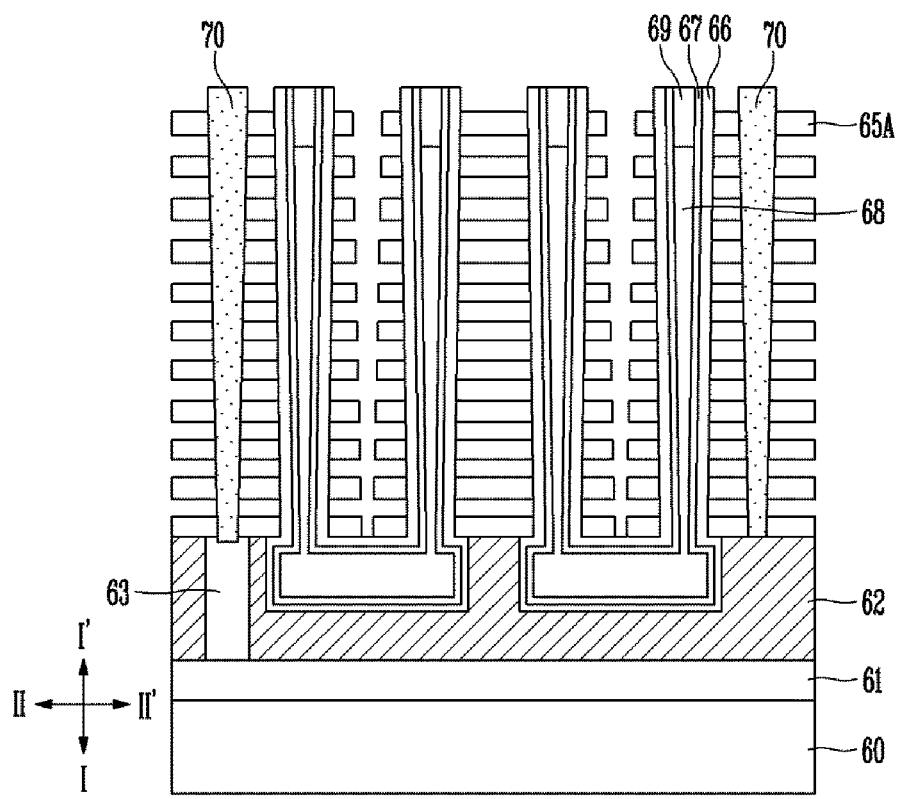

As shown in FIG. 4D, word line regions and select line regions are formed by recessing the first material layers 64A exposed to the plurality of second slits S2 and the plurality of sixth slits S6. Only the first material layers 64A are selectively recessed in the state in which the insulating layer 70 and the second material layers 65A remain filled in the plurality of first slits S1 and the plurality of third slits S3. The insulating layer 70 filled in the plurality of first slits S1 and the third slits S3 functions to prevent the second material layers 65A from collapsing when removing the first material layer 64A.

Figure 4E:
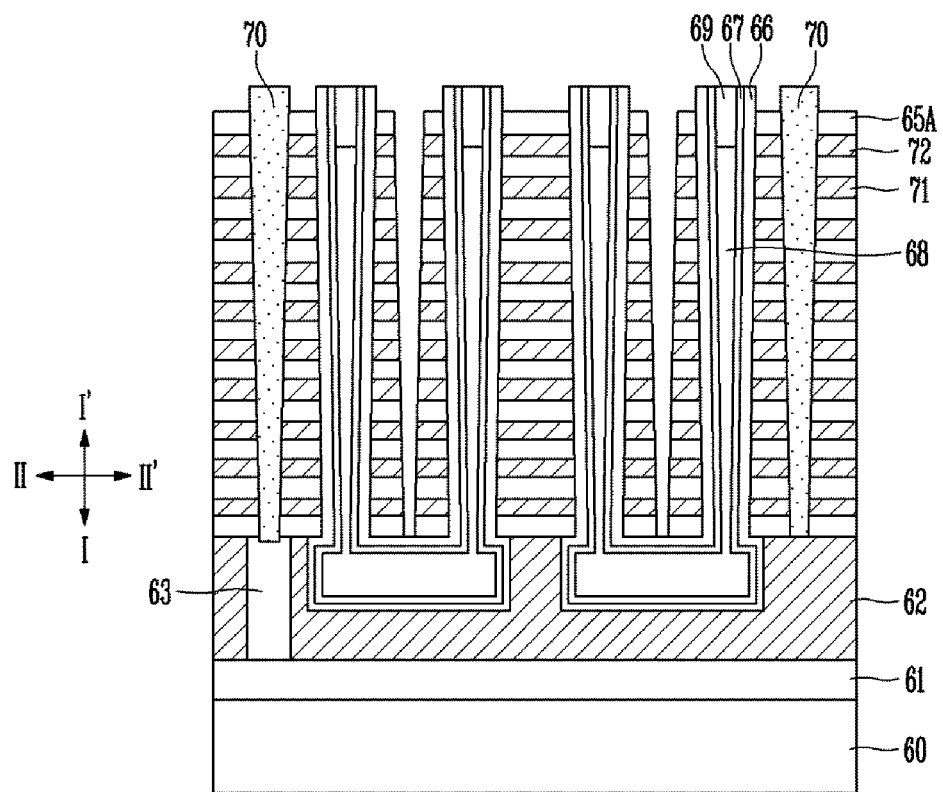

As shown in FIG. 4E, the word lines WL stacked in multiple layers and the select lines DSL and SSL stacked in one or more layers are formed by filling a first conductive layer in the word line regions and the select line regions. After the first conductive layer is formed to fill the word line regions and the select line regions, the first conductive layer formed at the bottom and on the inner walls of the second slit S2 and the sixth slit S6 may be removed so that each of the word lines WL and the select lines DSL and SSL is separated from each other.

If the first conductive layer is formed when the insulating layer 70 is not filled in the plurality of first slits S1, the first conductive layer may remain in the first slits S1 having a deep depth. In the first embodiment, the first conductive layer is formed after the insulating layer 70 is filled in the plurality of first slits S1. Thus, the first conductive layer can be prevented from remaining in the first slit S1.

Although not shown, the first conductive layer filled in the slimming region forms contact pads for coupling the contact plugs to the word lines WL.

Figure 4F:
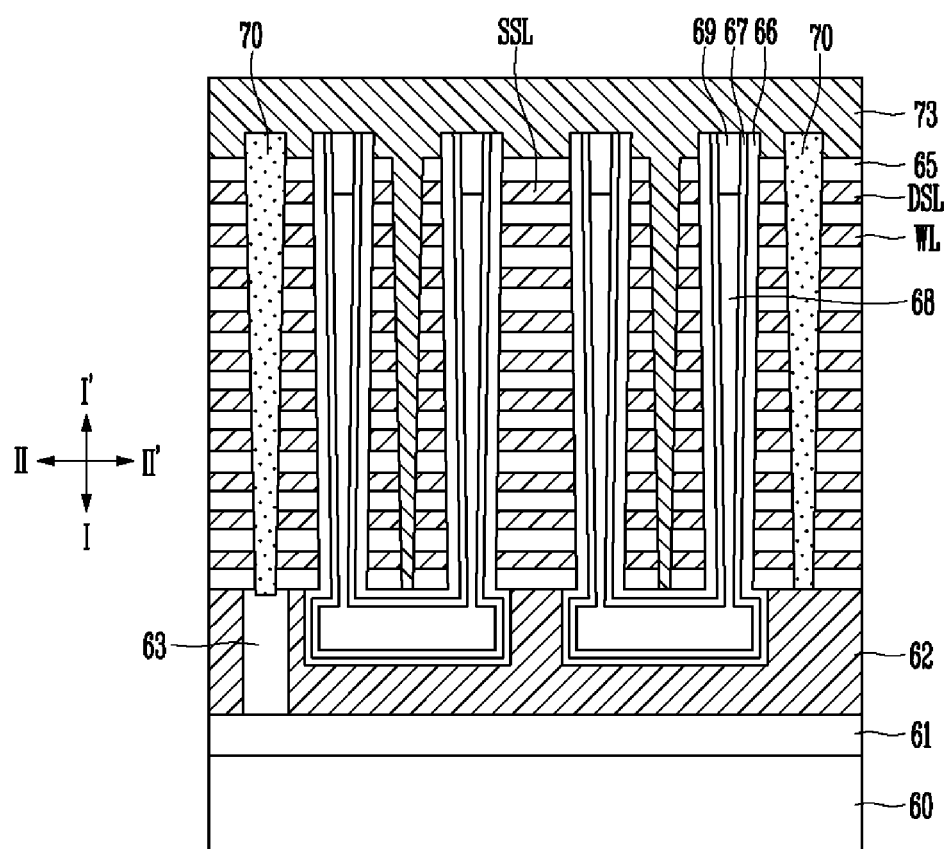

As shown in FIG. 4F, the plurality of second slits S2 and the plurality of sixth slits S6 are filled by forming a third interlayer insulating layer 73 on the result in which the word lines WL and the select lines DSL and SSL have been formed.

Processes after forming the second slits S2 and the sixth slits S6 may be different depending on the types of the first material layer 64 and the second material layer 65.

If the first material layer 64 is formed of a conductive layer and the second material layer 65 is formed of an insulating layer, the first material layer 64 exposed to the second slit S2 and the sixth slit S6 may be silicided. The insulating layer 73 may be filled in the second slit S2 and the sixth slit S6.

If the first material layer 64 is formed of a conductive layer and the second material layer 65 is formed of a sacrificial layer, the second material layer 65 exposed to the second slit S2 and the sixth slit S6 may be removed. The insulating layer 73 may be filled in the slits and the regions from which the second material layer 65 have been removed.

Figure 5:
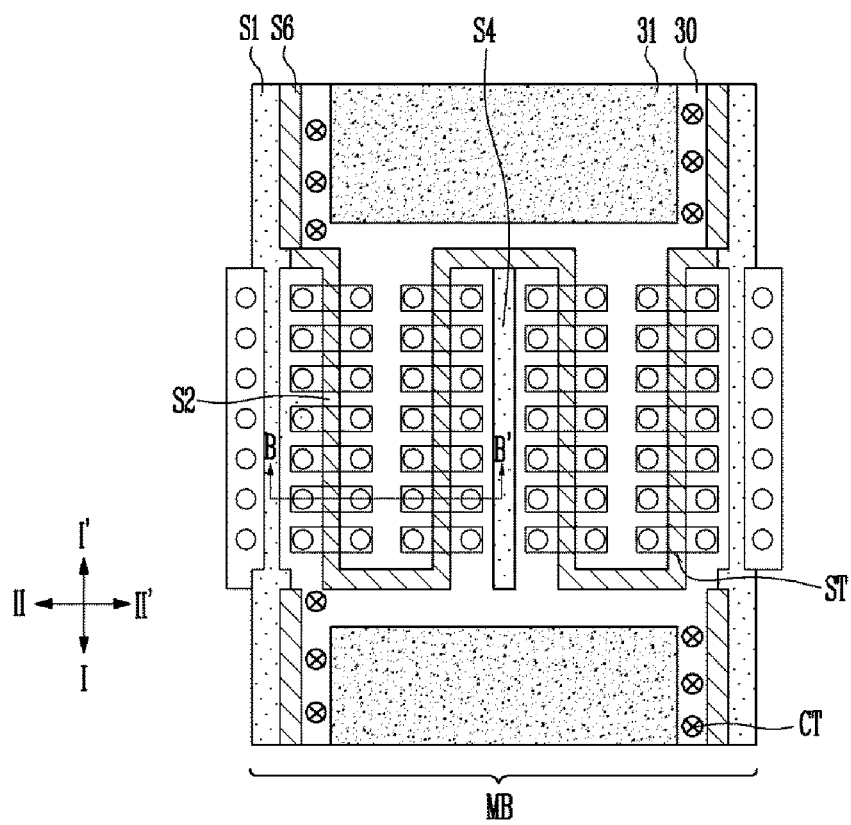
FIG. 5 is a layout diagram of a 3-D non-volatile memory device according to the second embodiment of this disclosure.

FIG. 5 is a layout diagram of a 3-D non-volatile memory device according to the second embodiment of this disclosure.

As shown in FIG. 5, the 3-D non-volatile memory device according to the second embodiment of this disclosure has a similar layout as that of the first embodiment, but includes the fourth slit S4 instead of the third slit S3 of the first embodiment.

In this structure, in the state in which the drain-side word lines D_WL of the strings ST adjacent to each other in the second direction II-II' are coupled, only the drain select lines DSL of the strings ST adjacent to each other in the second direction II-II' may be separated from each other with the fourth slit S4 interposed therebetween.

FIGS. 6A to 6F are cross-sectional views illustrating a method of manufacturing the 3-D non-volatile memory device according to the second embodiment of this disclosure. FIGS. 6A to 6F show the cross-sectional views of the 3-D non-volatile memory device taken along line B-B' of FIG. 5. A description of the contents of the second embodiment redundant with those of the first embodiment is omitted for simplicity.

Figure 6A:
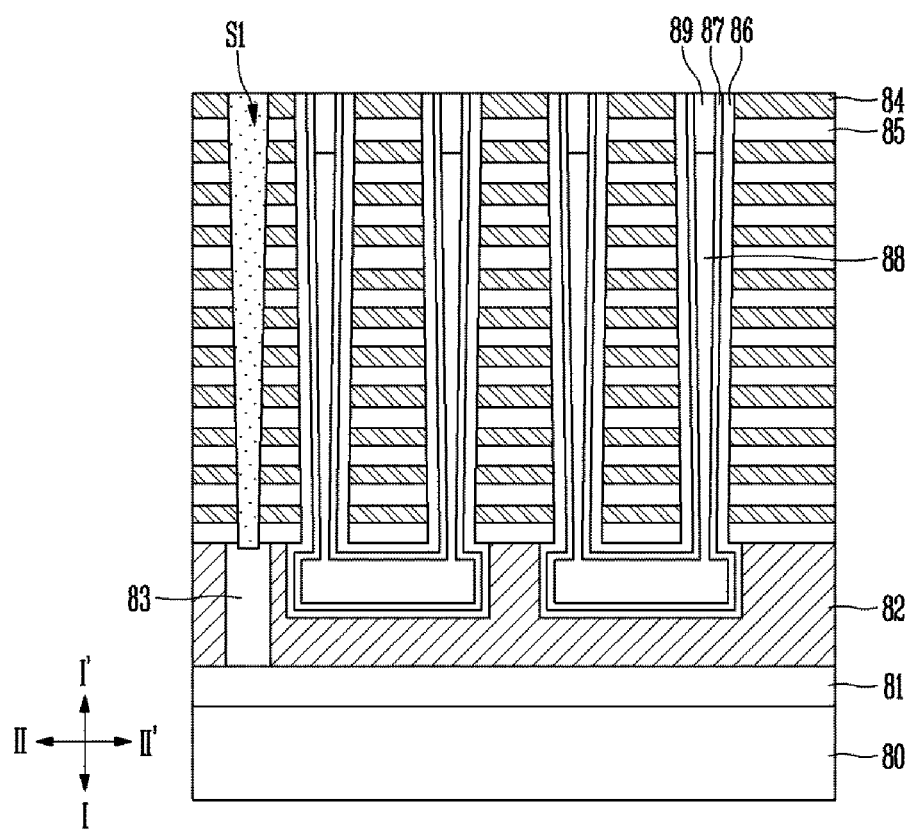
FIGS. 6A to 6F are cross-sectional views illustrating a method of manufacturing the 3-D non-volatile memory device according to the second embodiment of this disclosure.

As shown in FIG. 6A, a first interlayer insulating layer 81, pipe gates 82 separated adjacent memory blocks MB from each other with an insulating layer 83 interposed therebetween, and first material layers 84 and second material layer 85 alternately stacked over the pipe gates are formed over a substrate 80. In the second embodiment, it is assumed that the first material layer 84 is comprised of a sacrificial layer and the second material layer 85 is comprised of an interlayer insulating layer.

Channel layers 87, each including a pipe channel formed in the pipe gate 82 and a source-side channel coupled with a drain-side channel coupled via the pipe channel, are formed. The channel layer 87 is surrounded by a memory layer 86. An insulating layer 88 is filled in the central region of the channel layer 87, and conductive plugs 89 may be formed in the recessed regions of the insulating layer 88.

The first material layers 84 and the second material layers 85 are etched to form a plurality of the first slits S1 each placed between the adjacent memory blocks MB.

Figure 6B:
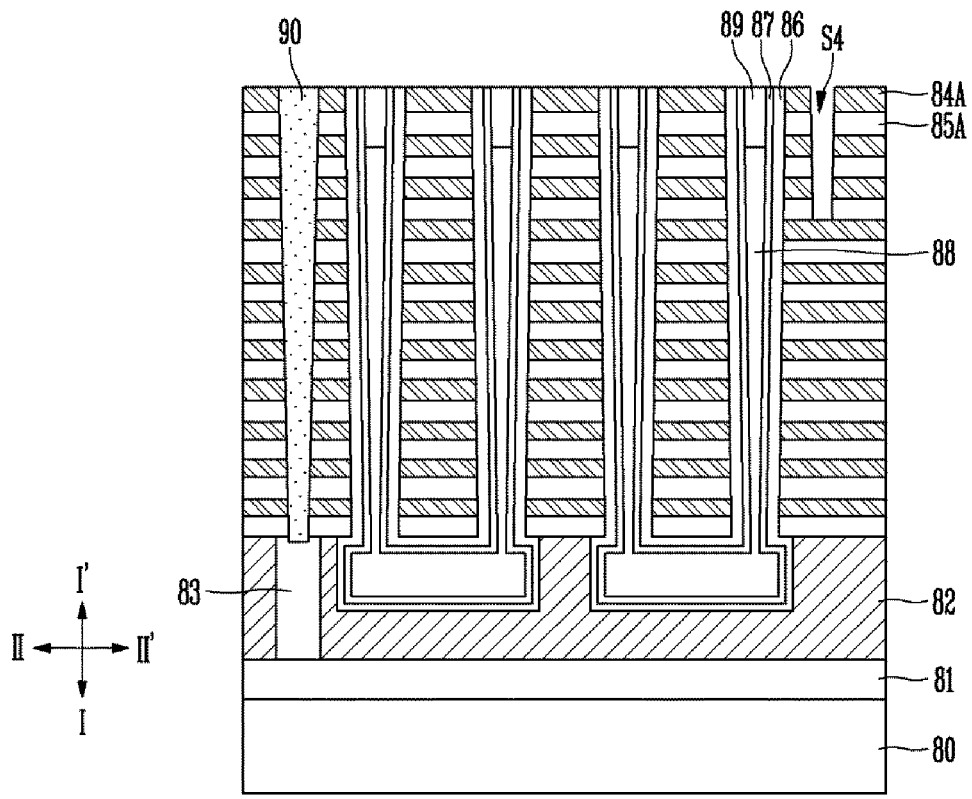

As shown in FIG. 6B, after an insulating layer 90 is filled into the plurality of first slits S1, a plurality of the fourth slits S4 each placed between the drain-side channels D_CH adjacent to other drain-side channels D_CH, is formed by etching the plurality of first sacrificial layers 84 and the plurality of second interlayer insulating layers 85 to a specific depth. The fourth slit S4 is formed to generally the same depth as the drain select lines DSL.

In FIG. 6B, the first material layers and the second material layers, etched when forming the fourth slit S4, are denoted by reference numeral '84A' and reference numeral '85A', respectively.

Figure 6C:
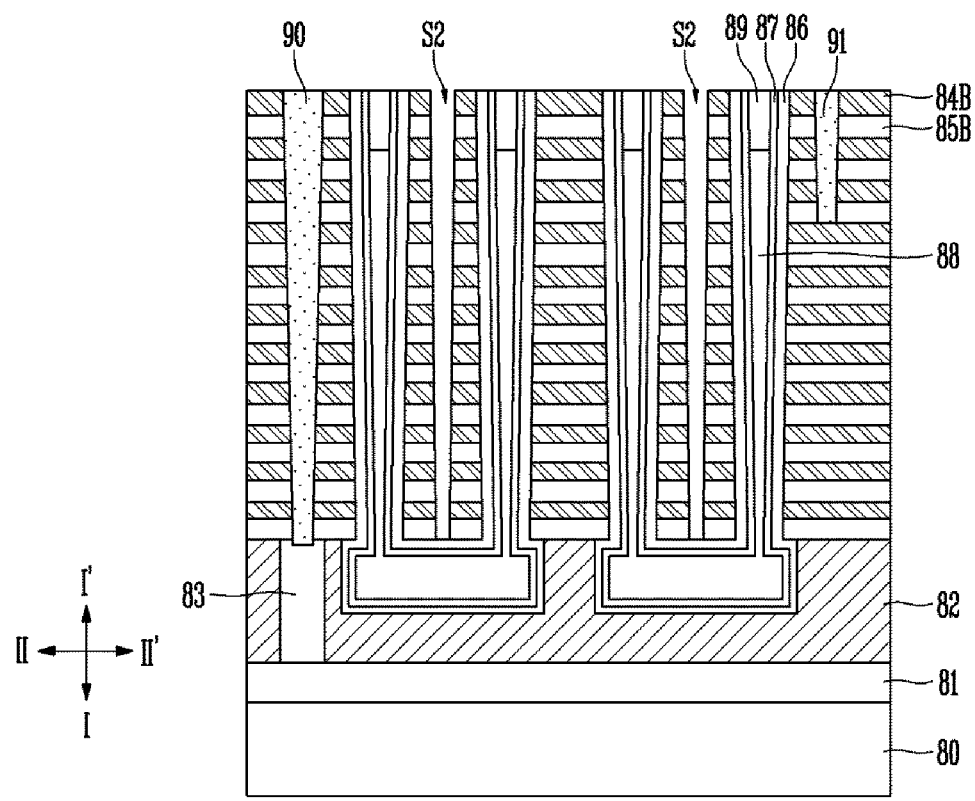

As shown in FIG. 6C, an insulating layer 91 is filled in the plurality of fourth slits S4. The insulating layer 91 may be formed of an oxide layer.

The first material layers 84A and the second material layers 85A are etched to form a plurality of the second slits S2 each placed between a source-side channel S_CH and a drain-side channel D_CH within each pair. Although not shown, when forming the plurality of second slits S2, the plurality of sixth slits S6 each placed between the first slit S1 and the slimming region is also formed. The second slit S2 and the sixth slit S6 may be formed to a depth to such an extent that the first material layers 84A are fully exposed.

In FIG. 6C, the first material layers and the second material layers, etched when forming the second slit S2 and the sixth slit S6, are denoted by reference numeral '84B' and reference numeral '85B', respectively.

Figure 6D:
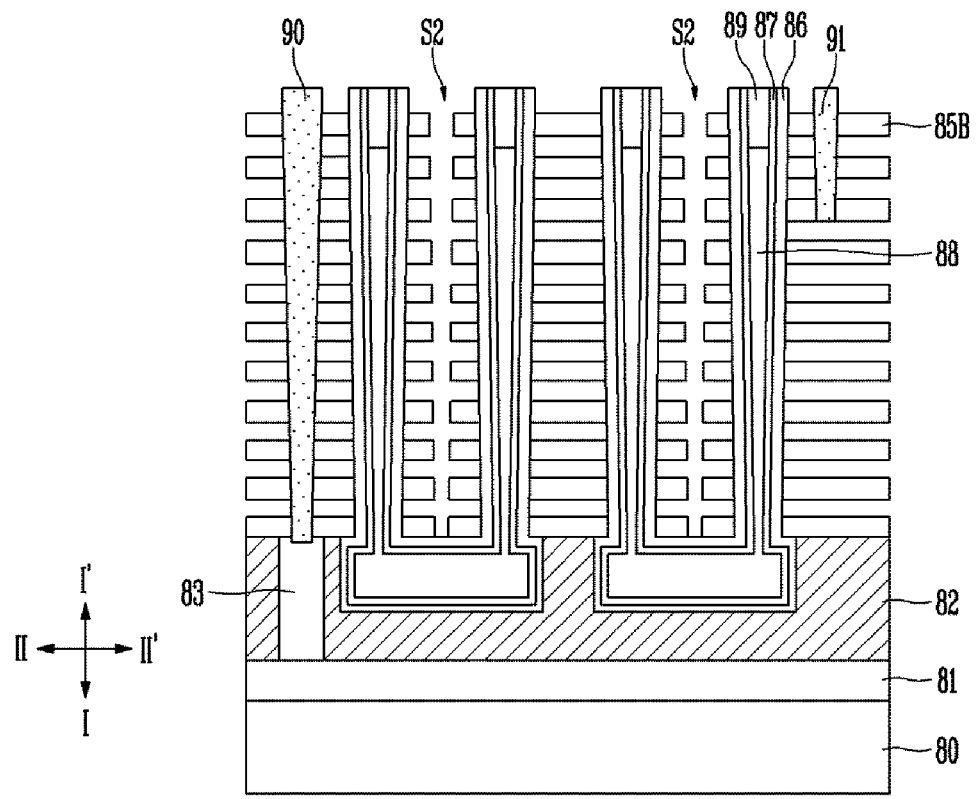

As shown in FIG. 6D, word line regions and select line regions are formed by recessing the first material layers 84B exposed to the plurality of second slits S2 and the plurality of sixth slits S6. Only the first material layers 84B are selectively recessed while the second material layers 85B remain. The insulating layers 90 and 91 filled in the plurality of first slits S1 and the fourth slits S4 functioning to prevent the second material layers 85B from collapsing.

Figure 6E:
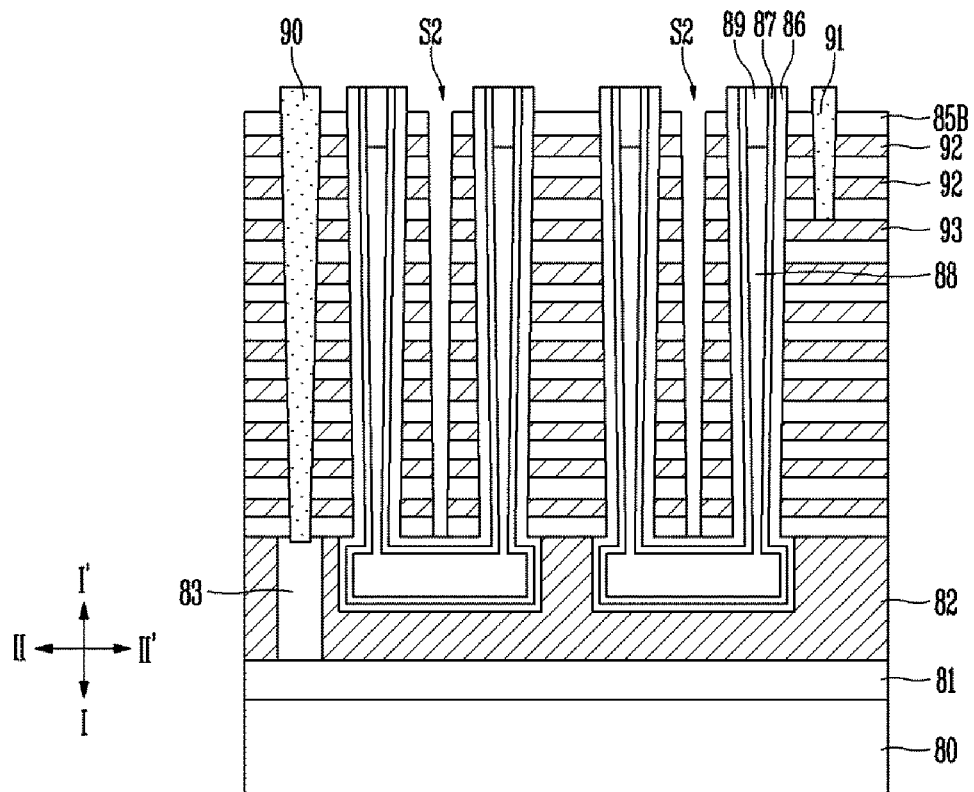

As shown in FIG. 6E, the word lines WL and the select lines DSL and SSL are formed by filling a first conductive layer in the word line regions and the select line regions.

Figure 6F:
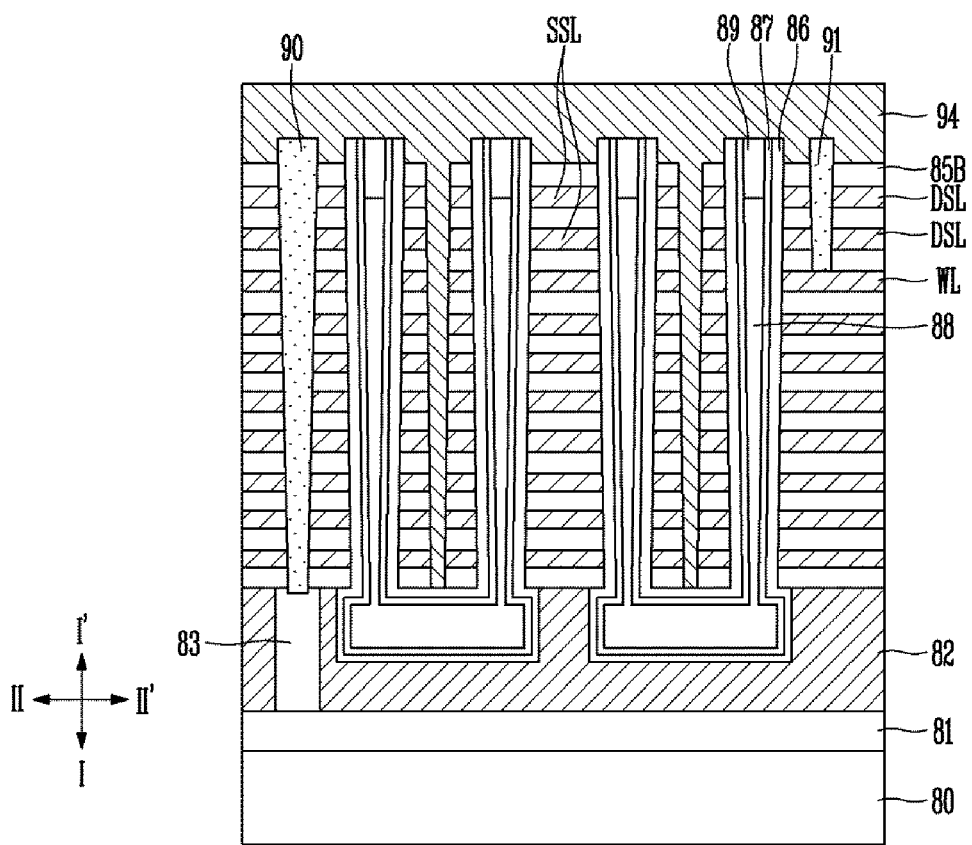

As shown in FIG. 6F, a third interlayer insulating layer 94 is formed generally above where the word lines WL and the select lines DSL and SSL have been formed, thereby filling the plurality of second slits S2 and the plurality of sixth slits S6.

Processes after forming the second slits S2 and the sixth slits S6 may vary depending on the types of the first material layer 84 and the second material layer 85.

Figure 7A:
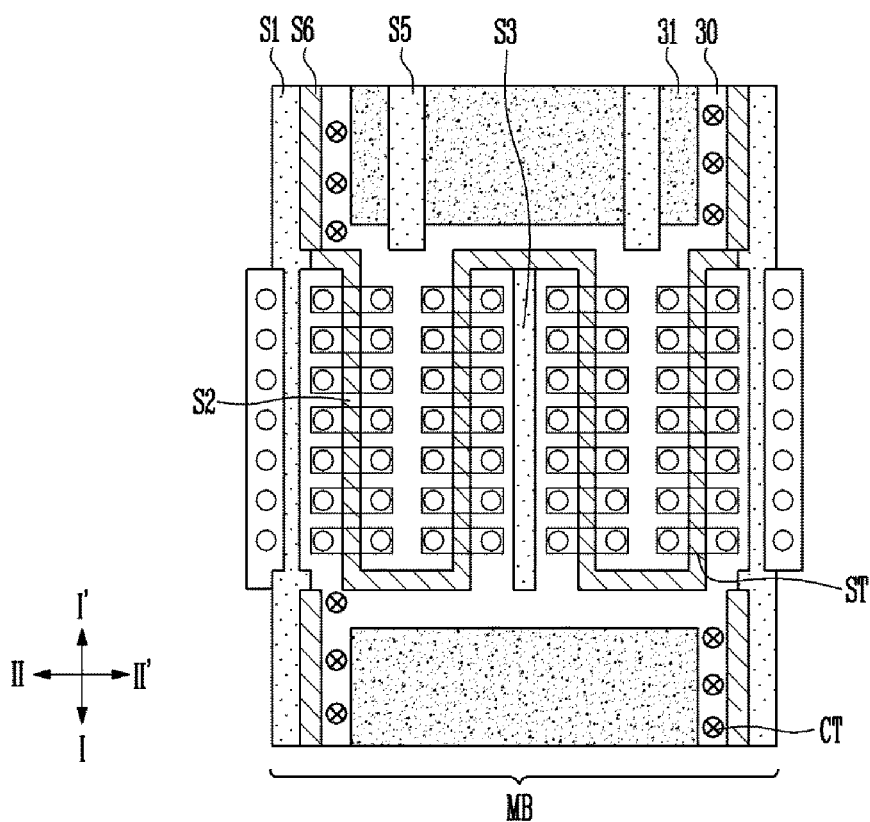
FIGS. 7A to 7C are layout diagrams of 3-D non-volatile memory devices according to third to fifth embodiments of this disclosure.
Figure 7B:
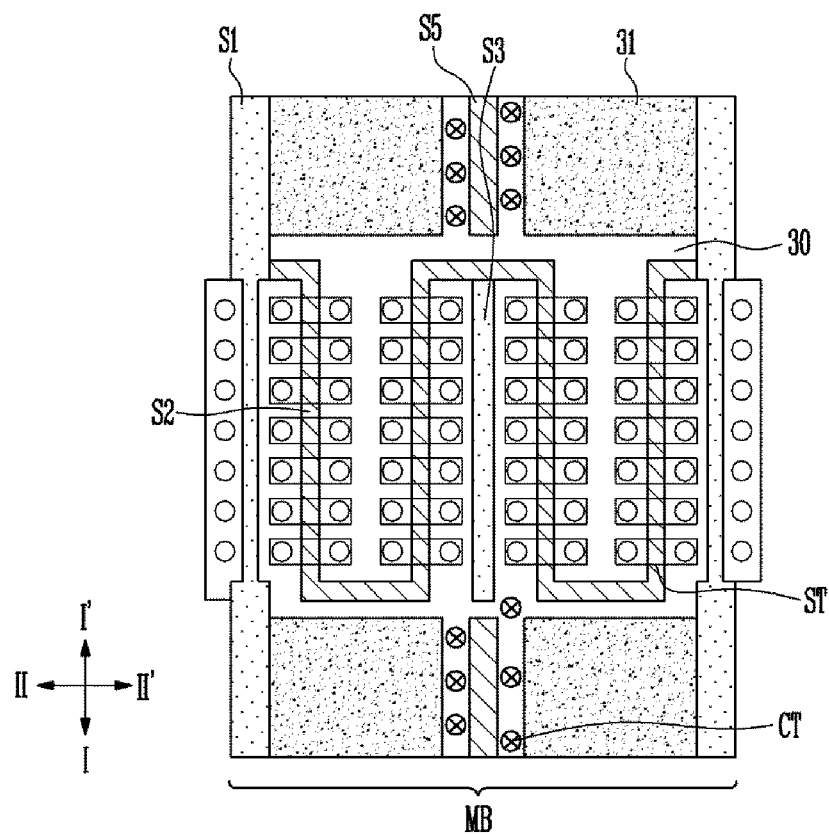
Figure 7C:
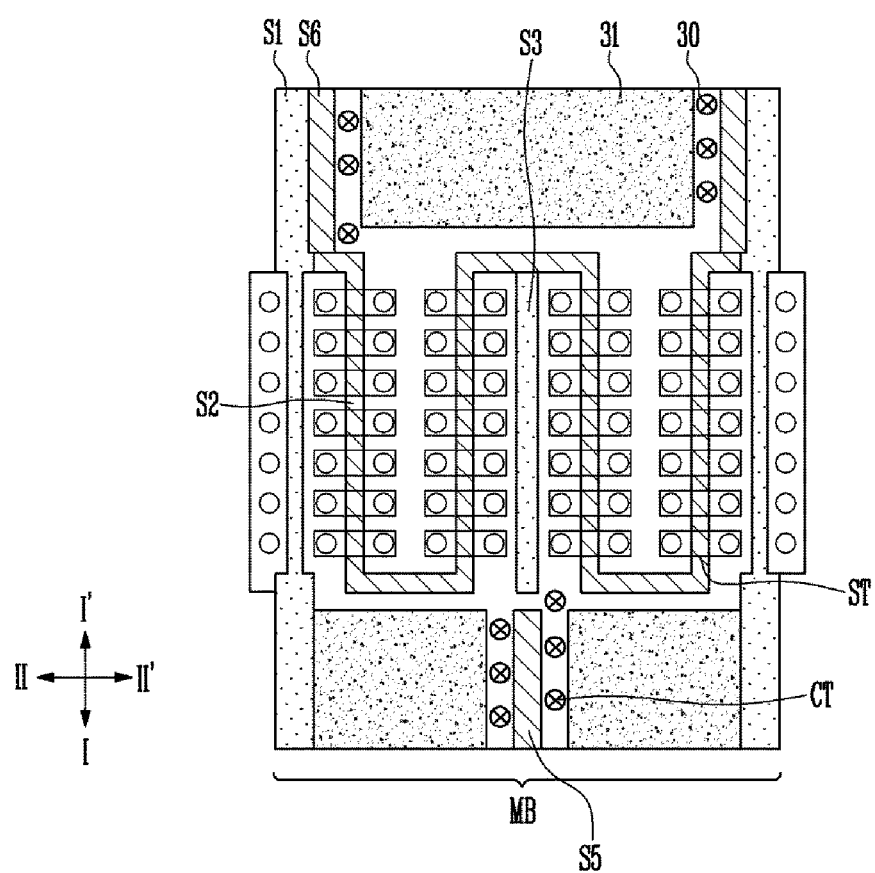

FIGS. 7A to 7C are layout diagrams of 3-D non-volatile memory devices according to the third to fifth embodiments of this disclosure.

FIG. 7A is a layout diagram of the 3-D non-volatile memory device according to the third embodiment of this disclosure.

As shown in FIG. 7A, the 3-D non-volatile memory device according to the third embodiment of this disclosure has a similar layout as that of the first embodiment, but further includes one or more fifth slits S5 formed within at least one of the upper or lower slimming regions in the first embodiment.

In the third embodiment, after forming the first slits S1, the third slit S3, and the one or more fifth slits S5 in the primary slit formation process, the insulating layer may be substantially filled. After forming the second slits S2 and the sixth slits S6 in the secondary slit formation process, the second sacrificial layers may be substantially recessed. The insulating layer filled into the one or more fifth slits S5 may effectively prevent the plurality of second interlayer insulating layers, formed in the upper slimming region, from collapsing when removing the second sacrificial layers.

FIG. 7B is a layout diagram of the 3-D non-volatile memory device according to the fourth embodiment of this disclosure.

As shown in FIG. 7B, the 3-D non-volatile memory device according to the fourth embodiment of this disclosure has a similar layout as that of the first embodiment, but further includes one or more fifth slits S5 formed within at least one of the upper or lower slimming regions instead of the sixth slits S6 used in the first embodiment.

In the fourth embodiment, after forming the first slits S1 and the third slit S3 in the primary slit formation process, the insulating layer may be substantially filled. Next, after forming the second slits S2 and the one or more fifth slits S5 in the secondary slit formation process, the second sacrificial layers may be substantially recessed. The contact pad may be formed within at least one of the upper or lower slimming regions via the one or more fifth slits S5.

FIG. 7C is a layout diagram of the 3-D non-volatile memory device according to the fifth embodiment of this disclosure.

As shown in FIG. 7C, the 3-D non-volatile memory device according to the fifth embodiment of this disclosure has a similar layout as that of the first embodiment, but further includes one or more fifth slits S5 formed within at least one of the upper or lower slimming regions in the first embodiment.

In the fifth embodiment, after forming the first slits S1 and the third slits S3 in the primary slit formation process, the insulating layer may be substantially filled. After forming the second slits S2, the one or more fifth slits S5, and the sixth slits S6 in the secondary slit formation process, the second sacrificial layers may be substantially recessed. First contact pads are formed at edges on both sides of the upper slimming region via the sixth slits S6, and a second contact pad is formed within the lower slimming region via the one or more fifth slits S5.

Figure 8:
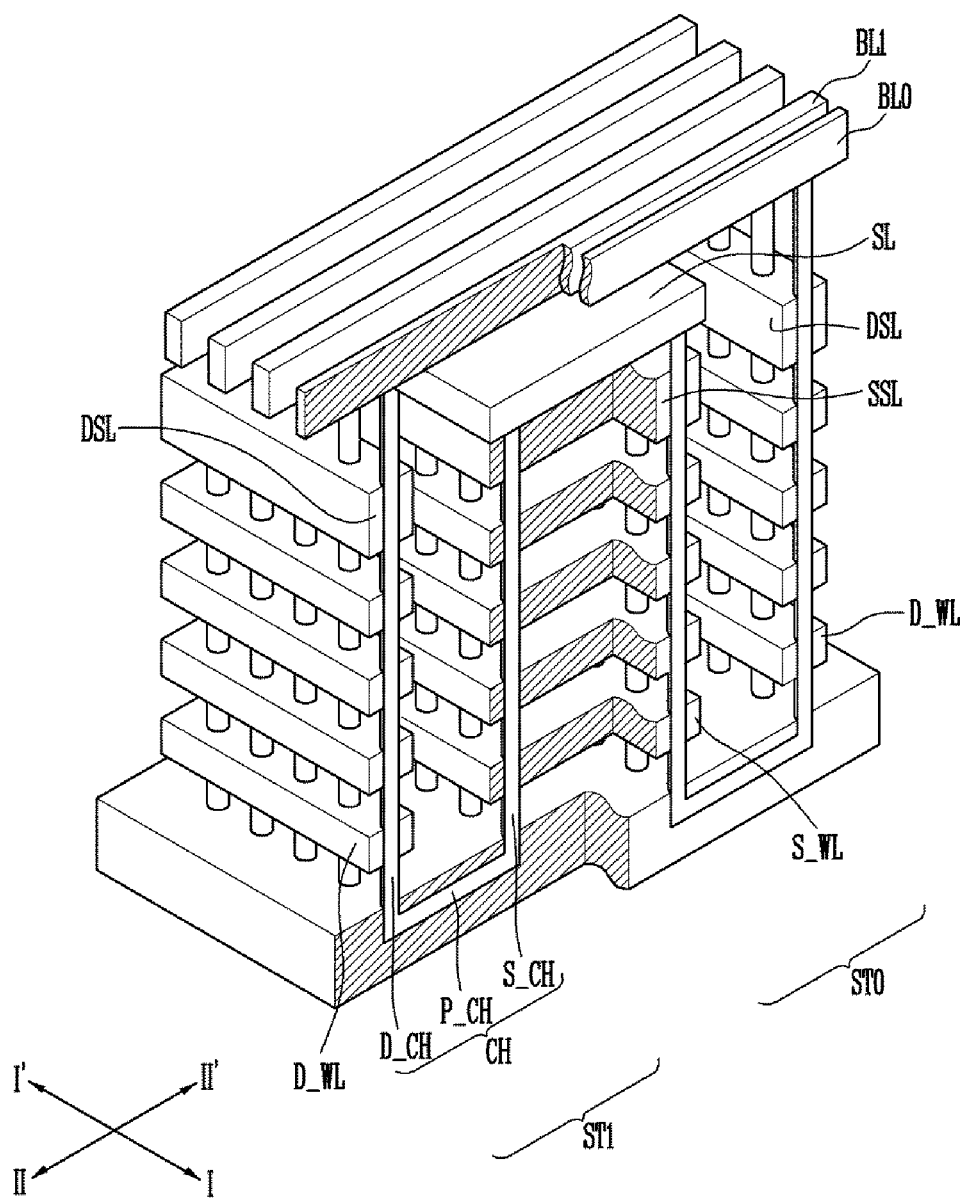
FIG. 8 is a perspective view of a 3-D non-volatile memory device according to sixth to twentieth embodiments of this disclosure.

FIG. 8 is a perspective view of a 3-D non-volatile memory device according to sixth to twentieth embodiments of this disclosure. It is to be noted that interlayer insulating layers are not shown in FIG. 8, for convenience of description, and only two strings ST1 and ST0 and elements related to the two strings are shown in FIG. 8, for simplicity.

As shown in FIG. 8, the 3-D non-volatile memory device according to the sixth to fourteenth embodiments of this disclosure has a similar structure as the 3-D non-volatile memory device shown in FIG. 1, but differs from the 3-D non-volatile memory device of FIG. 1 in that one string column extended in a second direction II-II' and formed in zigzags is coupled to at least two bit lines BL0 and BL1.

More specifically, strings ST0 and ST1 included in the one string column are arranged in generally a staggered form with each other in a first direction I-I' and are coupled to the at least two bit lines BL0 and BL1. FIG. 8 shows an example in which the string ST0 is coupled to the bit line BL0, and the string ST1 is coupled to the bit line BL1.

FIGS. 9A to 9I are layout diagrams of the 3-D non-volatile memory devices according to the sixth to fourteenth embodiments of this disclosure.

Figure 9A:
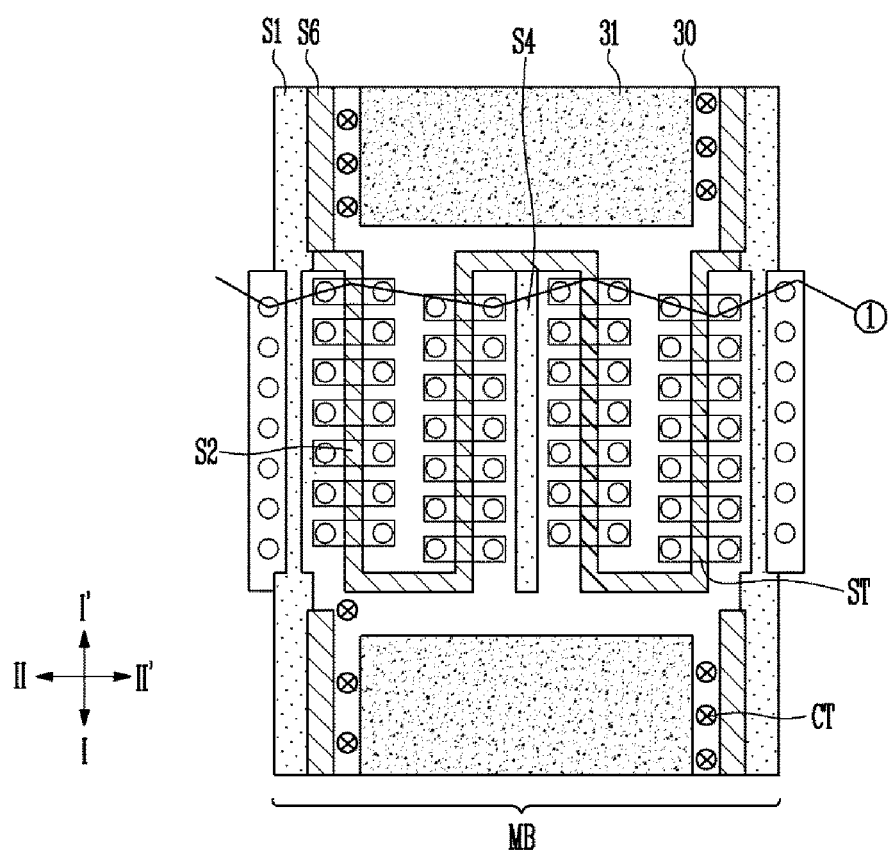
FIGS. 9A to 9O are layout diagrams of the 3-D non-volatile memory devices according to the sixth to twentieth embodiments of this disclosure.

FIG. 9A is a layout diagram of the 3-D non-volatile memory device according to the sixth embodiment of this disclosure.

As shown in FIG. 9A, the 3-D non-volatile memory device according to the sixth embodiment of this disclosure includes the one string column extended in zigzags (①) in the second direction II-II', a plurality of first slits S1 each placed between memory blocks MB adjacent to other memory blocks, a plurality of second slits S2 placed between a source-side channel S_CH and a drain-side channel D_CH, a plurality of fourth slits S4 each placed between the drain-side channels D_CH adjacent to other drain-side channels D_CH, and sixth slits S6 each placed between the first slit S1 and upper or lower slimming regions.

In the sixth embodiment, after forming the first slits S1 in a primary slit formation process, an insulating layer may be substantially filled. After forming the fourth slits S4, an insulating layer may be substantially filled. After forming the second slits S2 and the sixth slits S6 in a secondary slit formation process, second sacrificial layers may be substantially recessed.

Figure 9B:
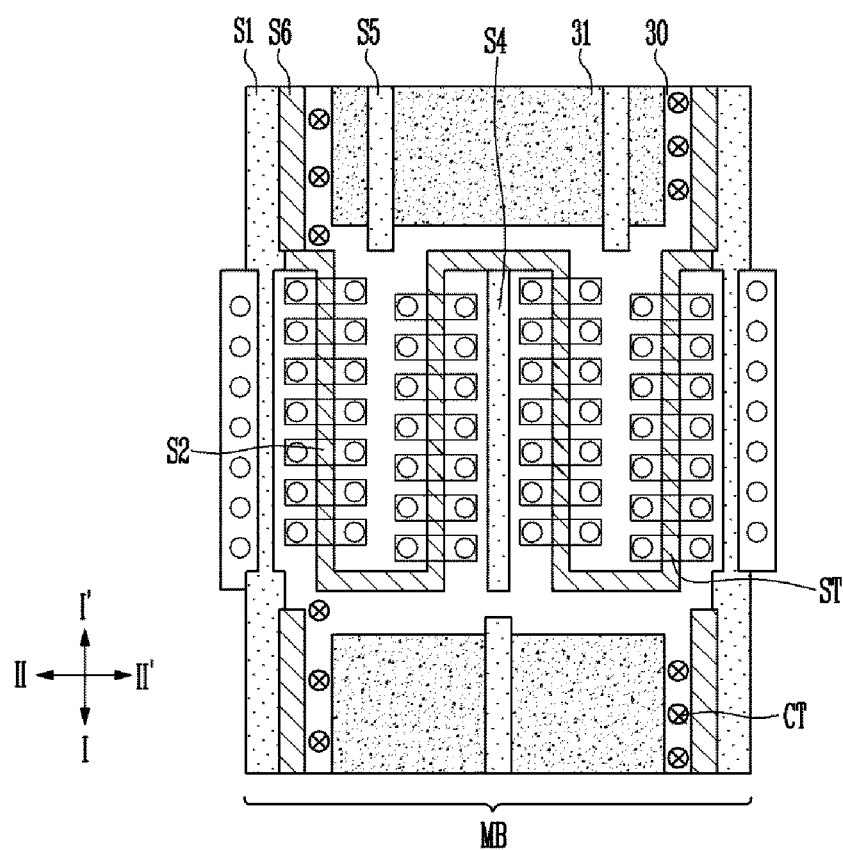

FIG. 9B is a layout diagram of the 3-D non-volatile memory device according to the seventh embodiment of this disclosure.

As shown in FIG. 9B, the 3-D non-volatile memory device according to the seventh embodiment of this disclosure has a similar layout as that of the sixth embodiment, but further includes one or more fifth slits S5 formed within at least one of the upper or lower slimming regions in the sixth embodiment.

The one or more fifth slits S5 may be formed at positions adjacent to the concave parts of second slits S2 arranged generally in zigzags. The upper slimming region and the lower slimming region may include multiple fifth slits S5 at various positions.

In the seventh embodiment, after forming first slits S1 and the one or more fifth slits S5 in a primary slit formation process, an insulating layer may be substantially filled. After forming fourth slit S4, an insulating layer may be substantially filled. After forming second slits S2 and sixth slits S6 in a secondary slit formation process, second sacrificial layers may be substantially recessed.

Figure 9C:
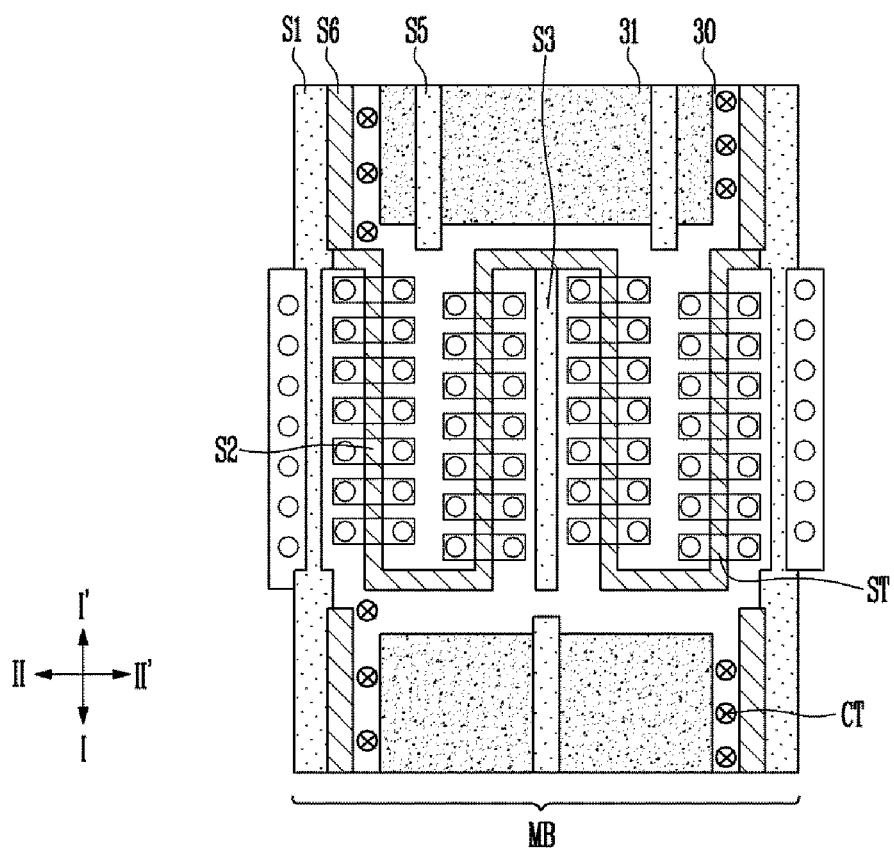

FIG. 9C is a layout diagram of the 3-D non-volatile memory device according to the eighth embodiment of this disclosure.

As shown in FIG. 9C, the 3-D non-volatile memory device according to the eighth embodiment of this disclosure has a similar layout as that of the seventh embodiment, but includes a third slit S3 instead of the fourth slits S4.

In the eighth embodiment, after forming first slits S1, the third slit S3, and fifth slits S5 in a primary slit formation process, an insulating layer may be substantially filled. After forming second slits S2 and sixth slits S6 in a secondary slit formation process, second sacrificial layers may be substantially recessed.

Figure 9D:
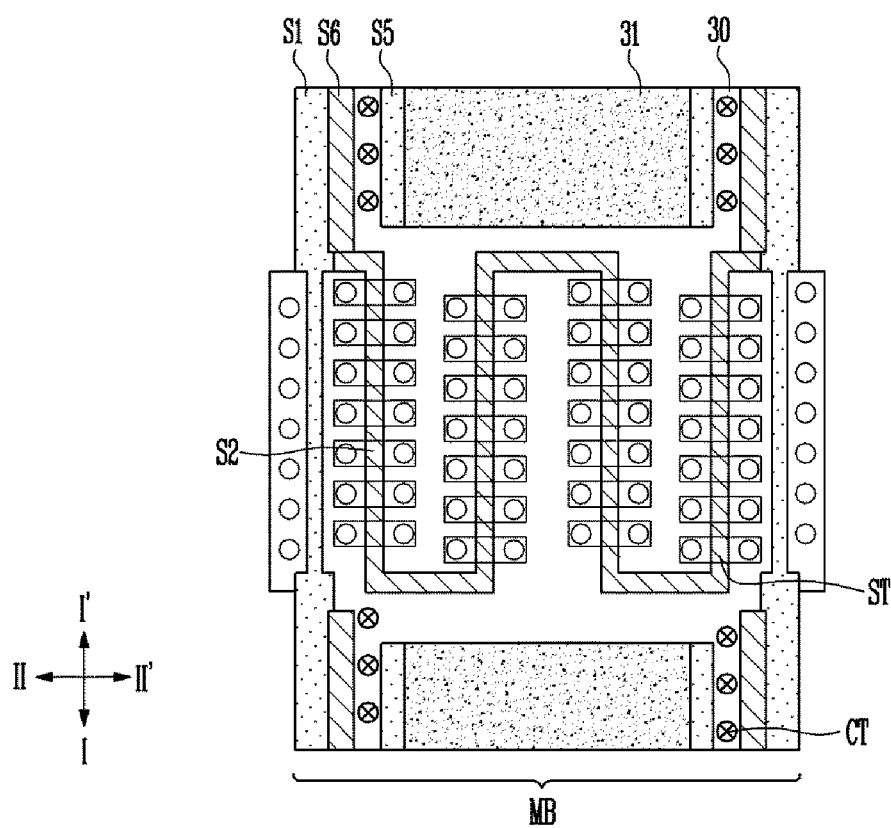

FIG. 9D is a layout diagram of the 3-D non-volatile memory device according to the ninth embodiment of this disclosure.

As shown in FIG. 9D, the 3-D non-volatile memory device according to the ninth embodiment of this disclosure includes a plurality of first slits S1 each placed between memory blocks MB adjacent to other memory blocks, a plurality of second slits S2 placed between a source-side channel S_CH and a drain-side channel D_CH, one or more fifth slits S5 formed within at least one of upper or lower slimming regions, and sixth slits S6 each placed between the first slit S1 and the upper or lower slimming regions.

The fifth slits S5 may be placed at the edges of the slimming regions and generally formed in a line.

In the ninth embodiment, after forming the first slits S1 and the one or more fifth slits S5 in a primary slit formation process, an insulating layer may be substantially filled. After forming the second slits S2 and the sixth slits S6 in a secondary slit formation process, second sacrificial layers may be substantially recessed.

Figure 9E:
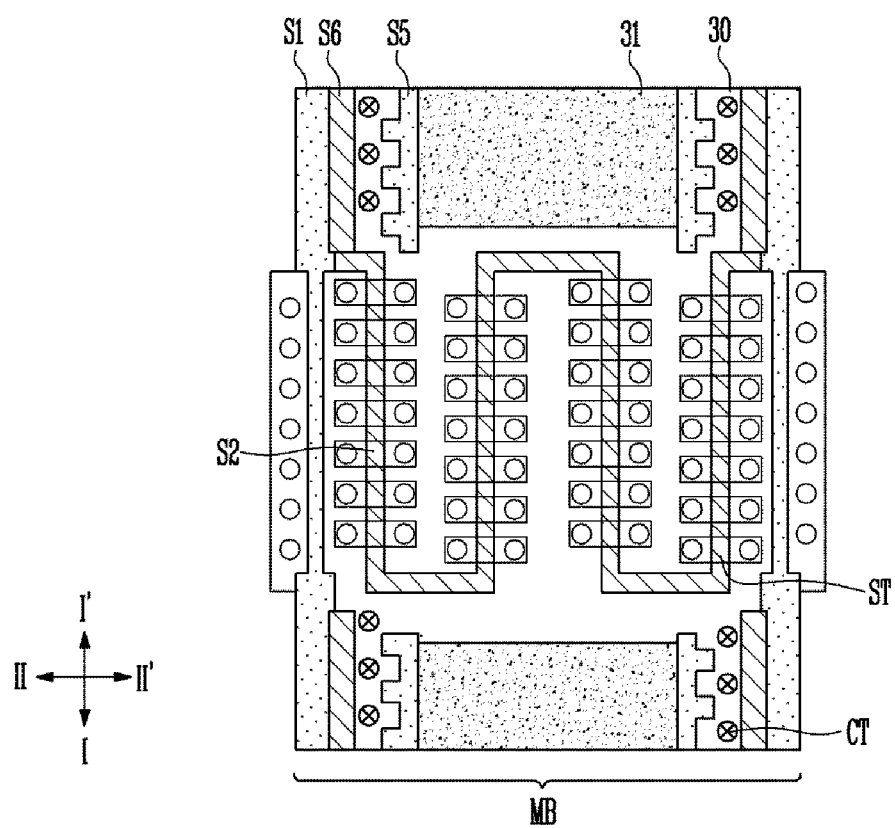

FIG. 9E is a layout diagram of the 3-D non-volatile memory device according to the tenth embodiment of this disclosure.

As shown in FIG. 9E, the 3-D non-volatile memory device according to the tenth embodiment of this disclosure has a similar layout as the 3-D non-volatile memory device of the ninth embodiment, but differs from that of the ninth embodiment in the shapes of the fifth slits S5.

Each of the fifth slits S5 may be formed generally in a line having one or more projecting parts. The projecting parts may protrude toward a contact pad, and contact plugs may be placed between the projecting parts. In particular, the contact plugs may be placed within the concave portions between the projecting parts. The fifth slits S5 formed within the upper slimming region and the fifth slits S5 formed within the lower slimming region may have the same shapes or different shapes.

In the tenth embodiment, the slits may be formed in the same order as those of the ninth embodiment.

Figure 9F:
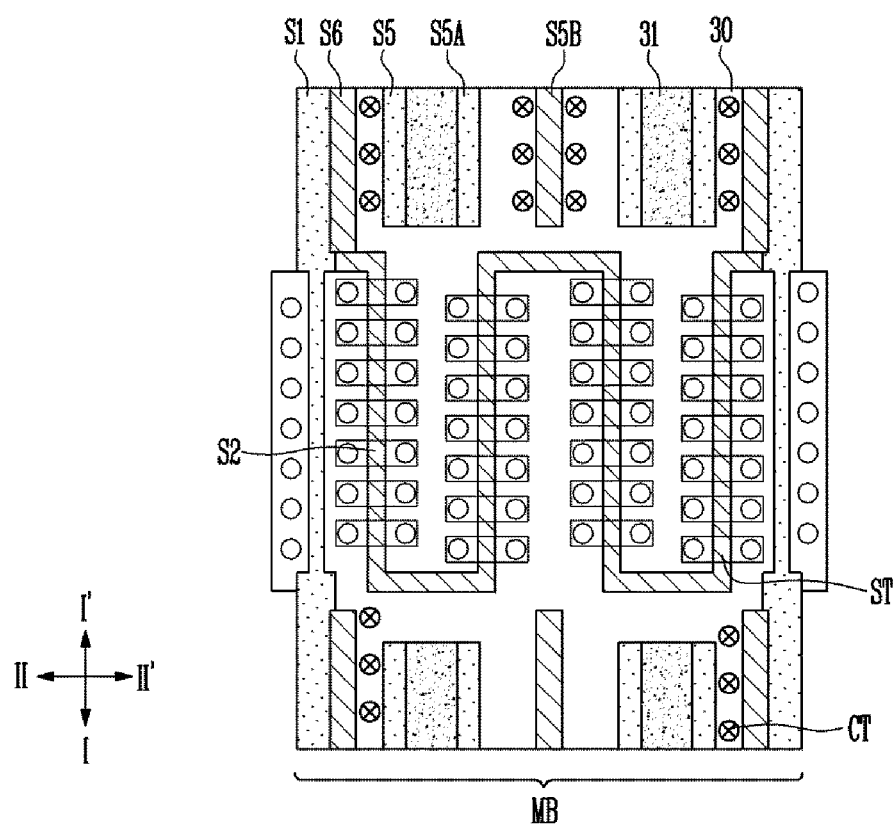

FIG. 9F is a layout diagram of the 3-D non-volatile memory device according to the eleventh embodiment of this disclosure.

As shown in FIG. 9F, the 3-D non-volatile memory device according to the eleventh embodiment of this disclosure has a similar layout as the 3-D non-volatile memory device of the ninth embodiment, but differs from that of the ninth embodiment in the shapes of the fifth slits S5A and S5B.

More specifically, the fifth slits S5A and S5B may be extended generally in parallel in a first direction I-I' and each may be generally formed in a line. The fifth slits S5A may be formed in a primary slit formation process, and the remaining fifth slits S5B may be formed in a secondary slit formation process. Contact pads are formed on both sides of the fifth slit S5B formed in the secondary slit formation process. The contact pads are formed within at least one of the upper or lower slimming regions.

In the eleventh embodiment, after forming the first slits S1 and the fifth slits S5A in the primary slit formation process, an insulating layer may be substantially filled. After forming the second slits S2, the remaining fifth slits S5B, and the sixth slits S6 in the secondary slit formation process, second sacrificial layers may be substantially recessed.

Figure 9G:
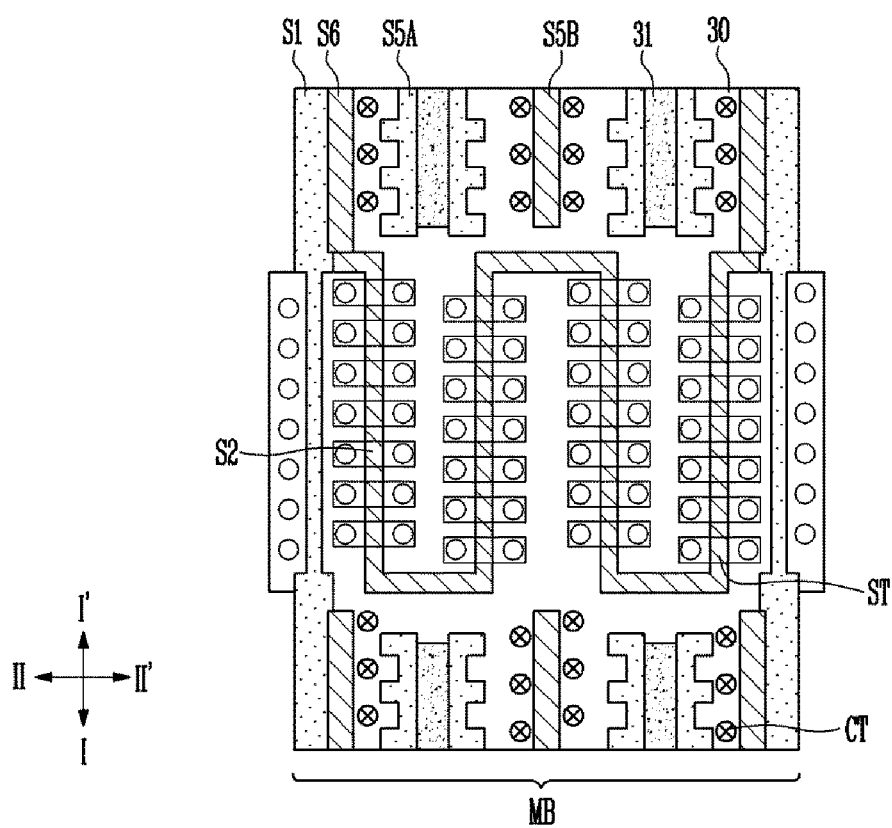

FIG. 9G is a layout diagram of the 3-D non-volatile memory device according to the twelfth embodiment of this disclosure.

As shown in FIG. 9G, the 3-D non-volatile memory device according to the twelfth embodiment of this disclosure has a similar layout as the 3-D non-volatile memory device of the eleventh embodiment, but differs from that of the eleventh embodiment in the shapes of the fifth slits S5.

Each of the fifth slits S5A generally form a line having projecting parts, and each of the remaining fifth slits S5B generally form a line. Each of the fifth slits S5A placed at the edges of a slimming region has the projecting parts protruded toward contact pads, and the fifth slits S5A separated by region 31 may generally have a symmetrical shape. That is, each of the adjacent fifth slits S5A separated by region 31 may have the projecting parts protruded in generally opposite directions. The fifth slit S5B placed at the central part of the slimming region may generally form a line.

In the twelfth embodiment, the slits may be formed in the same order as those of the eleventh embodiment.

Figure 9H:
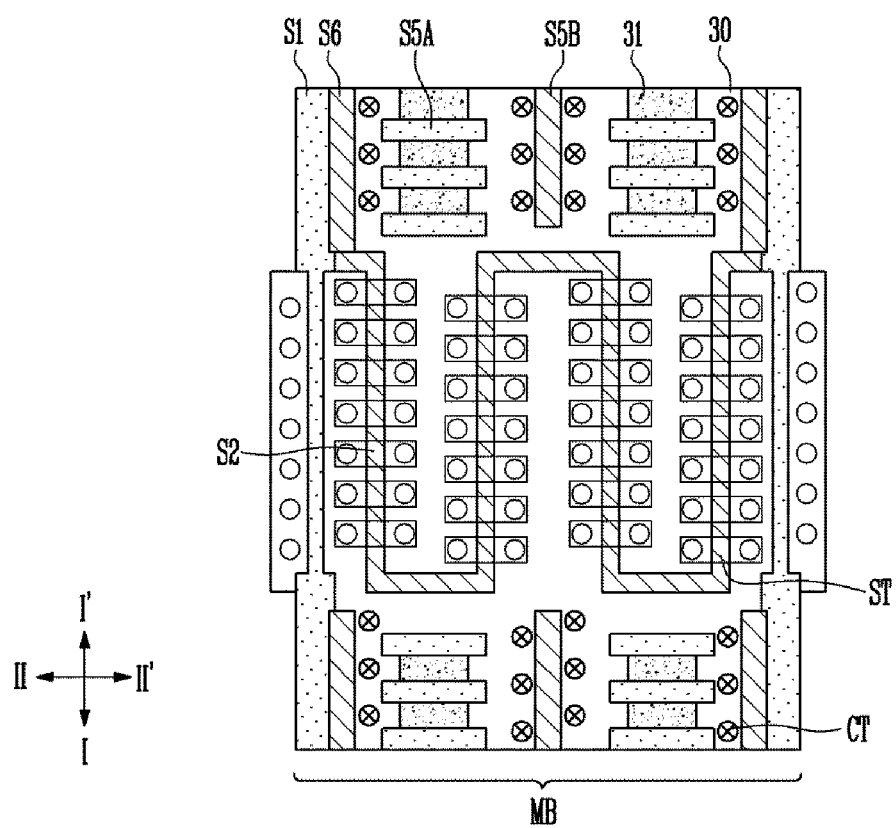

FIG. 9H is a layout diagram of the 3-D non-volatile memory device according to the thirteenth embodiment of this disclosure.

As shown in FIG. 9H, the 3-D non-volatile memory device according to the thirteenth embodiment of this disclosure has a similar layout to the 3-D non-volatile memory device of the eleventh embodiment, but differs from that of the eleventh embodiment in the shapes of the fifth slits S5A and S5B. Some of the fifth slits S5A are formed in alternating line forms extended generally in parallel in a second direction II-II', and the remaining fifth slits S5B have a line form extended generally in the first direction I-I'. Each of the fifth slits S5A and S5B may be placed between the contact pads.

In the thirteenth embodiment, the slits may be formed in the same order as those of the eleventh embodiment.

Figure 9I:
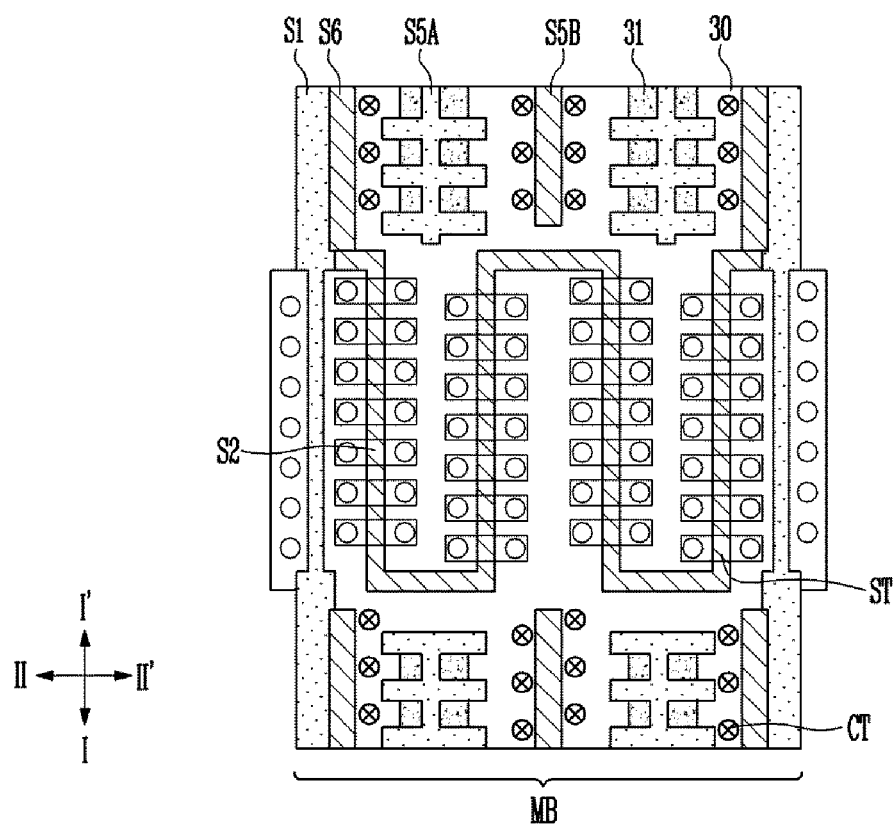

FIG. 9I is a layout diagram of the 3-D non-volatile memory device according to the fourteenth embodiment of this disclosure.

As shown in FIG. 9I, the 3-D non-volatile memory device according to the fourteenth embodiment of this disclosure has a similar layout as the 3-D non-volatile memory device of the thirteenth embodiment, but differs from that of the thirteenth embodiment in the shapes of the fifth slits S5.

Each of the fifth slits S5 has a form in which a first line pattern extended generally in a first direction I-I' and second line patterns extended generally in parallel in a second direction II-II' generally cross each other, and each of the remaining fifth slits S5B has a line form extended generally in the first direction I-I'.

The fifth slits S5A formed within the upper slimming region and the fifth slits S5A formed within the lower slimming region may have different shapes. The fifth slit S5A may have a different shape depending if S5A is adjacent to the concave and projecting part of the second slits S2 which are arranged generally in zigzags.

For example, the fifth slit S5A formed within the upper slimming region has a form in which the line pattern extended in the first direction I-I' is protruded because it is adjacent to the concave and projecting part of the second slit S2. The fifth slit S5A formed within the lower slimming region has a form in which the line pattern extended in the first direction I-I' is not protruded because it is not adjacent to the projecting part of the second slit S2.

In the fourteenth embodiment, the slits may be formed in the same order as those of the eleventh embodiment.

The remaining fifth slits S5B have a line form extended generally in the first direction I-I'.

Figure 9J:
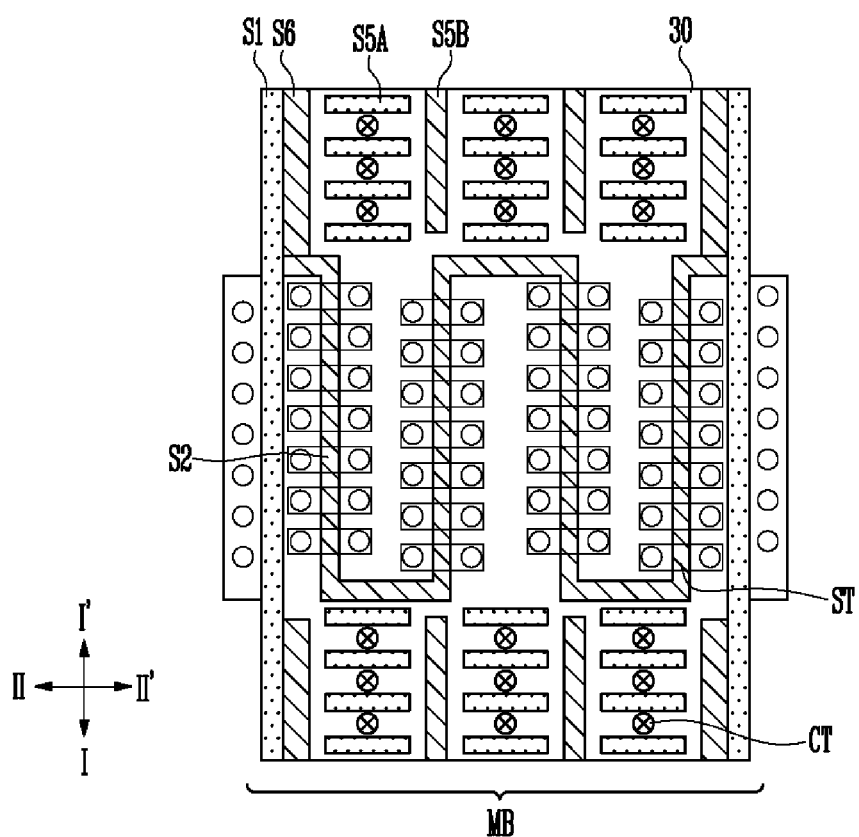

FIG. 9J is a layout diagram of a 3-D non-volatile memory device according to the fifteenth embodiment of this disclosure.

As shown in FIG. 9J, the 3-D non-volatile memory device according to the fifteenth embodiment of this disclosure has a similar layout to that of the thirteenth embodiment, but differs from that of the thirteenth embodiment in the number of the fifth slits S5A and S5B.

For example, the fifth slits S5A extended generally in a second direction II-II' are arranged in groups each including the four slits S5A, and the fifth slits S5A forming a total of six groups, three groups being formed per each slimming region. Furthermore, each of the fifth slits S5B extended generally in a first direction I-I' may be formed between all of the groups or may be formed between some of the groups. If all of the fifth slits S5B are formed between the groups adjacent to each other as in the fifteenth embodiment, first material layers stacked in the slimming region can be sufficiently recessed through the fifth slits S5B. Here, since an insulating layer buried in the fifth slits S5A is used as a support, a contact pad having sufficient size can be formed because the first material layers of the slimming region may be fully removed. Furthermore, since a contact pad is generally formed in the slimming region, a contact plug CT may be formed between the fifth slits S5A.

For reference, the fifteenth embodiment shows an example in which a first slit S1 generally has a line form generally having a uniform width. As in the above-described embodiments, however, the first slit S1 may be formed to have a relatively wide width in the slimming region, but also having a relatively narrow width in the cell region.

The slits in the fifteenth embodiment may be formed in the same order as those in the eleventh embodiment.

Figure 9K:
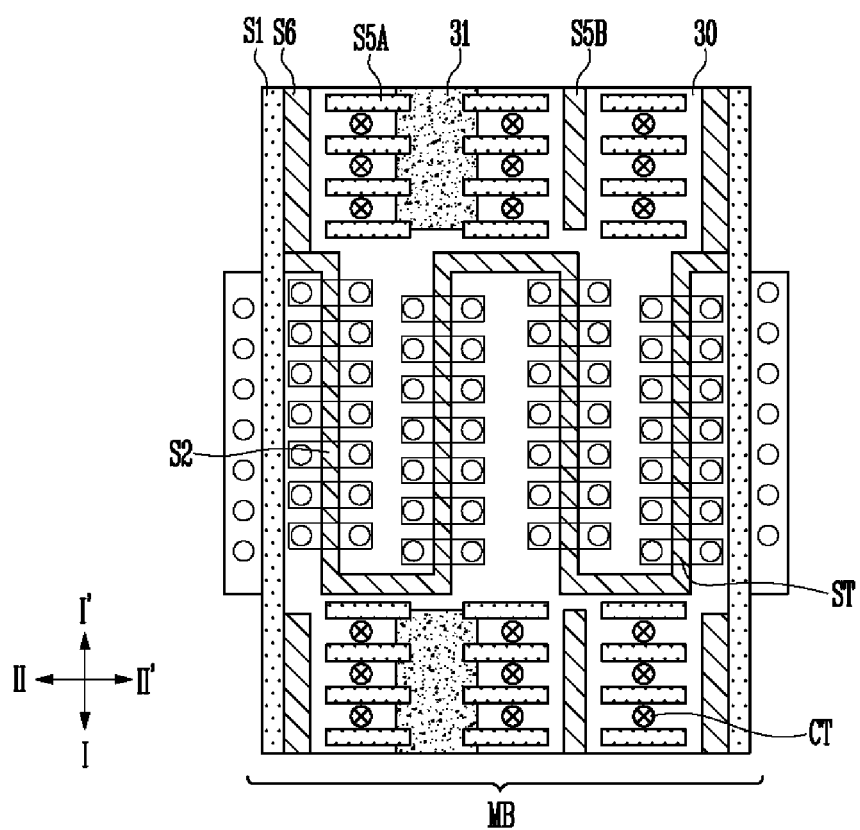

FIG. 9K is a layout diagram of a 3-D non-volatile memory device according to the sixteenth embodiment of this disclosure.

As shown in FIG. 9K, the 3-D non-volatile memory device according to the sixteenth embodiment of this disclosure has a similar layout to that of the fifteenth embodiment, but differs from that of the fifteenth embodiment in the number of fifth slits S5B.

The fifth slits S5B extended generally in a first direction I-I' may be formed between some of the adjacent groups created by fifth slits S5A. The fifth slits S5B may be formed in a secondary slit formation process and may be used to remove first material layers. In accordance with the sixteenth embodiment, the first material layers may remain in regions where the fifth slit S5B are not formed (i.e., see reference numeral '31').

The slits in the sixteenth embodiment may be formed in generally the same order as those in the eleventh embodiment.

Figure 9L:
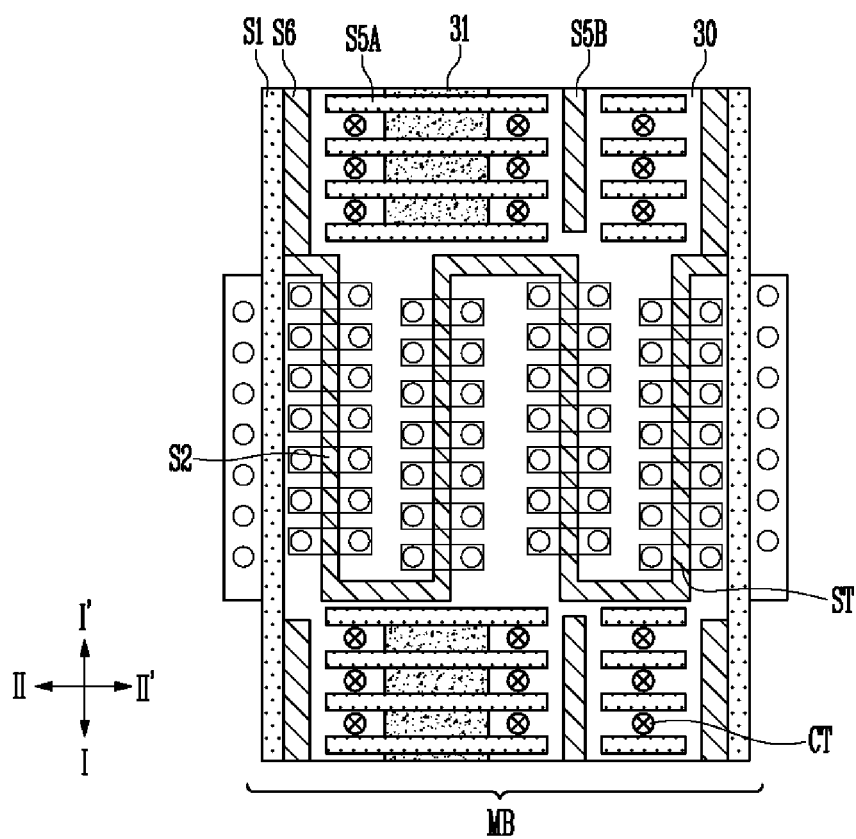

FIG. 9L is a layout diagram of a 3-D non-volatile memory device according to the seventeenth embodiment of this disclosure.

As shown in FIG. 9L, the 3-D non-volatile memory device according to the seventeenth embodiment of this disclosure has a similar layout to that of the sixteenth embodiment, but differs from that of the sixteenth embodiment by the length of fifth slits S5A. For example, some of the fifth slits S5A, extended generally in a second direction II-II', may have a relatively longer length than other remaining slits S5A. In this embodiment, first material layers may generally remain in regions where the fifth slits S5A having the longer length are formed (i.e., see reference numeral '31').

The slits in the seventeenth embodiment may be formed in the same order as those in the eleventh embodiment.

Figure 9M:
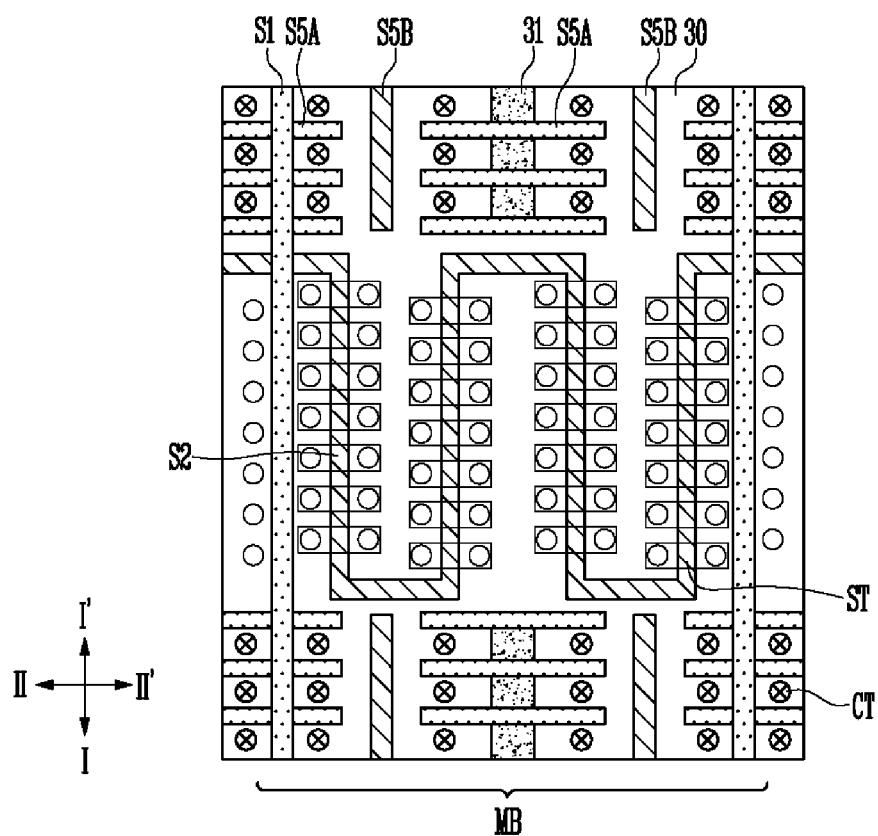

FIG. 9M is a layout diagram of a 3-D non-volatile memory device according to the eighteenth embodiment of this disclosure.

As shown in FIG. 9M, the 3-D non-volatile memory device according to the eighteenth embodiment of this disclosure has a similar layout to that of the fifteenth embodiment, but differs from that of the fifteenth embodiment by where the positions of fifth slits S5A are formed. For example, some of the fifth slits S5A generally extend in a second direction II-II' and may be formed to generally cross the boundaries of the adjacent memory blocks. In this embodiment, the fifth slits S5A may generally cross a first slit S1 at the boundary of the adjacent memory blocks.

Furthermore, in accordance with the eighteenth embodiment, a contact plug CT may be formed between the fifth slits S5A. In particular, the contact plugs CT may be formed not only at the edges of slimming regions, but also within the slimming regions.

The slits in the eighteenth embodiment may be formed in the same order as those in the eleventh embodiment.

Figure 9N:
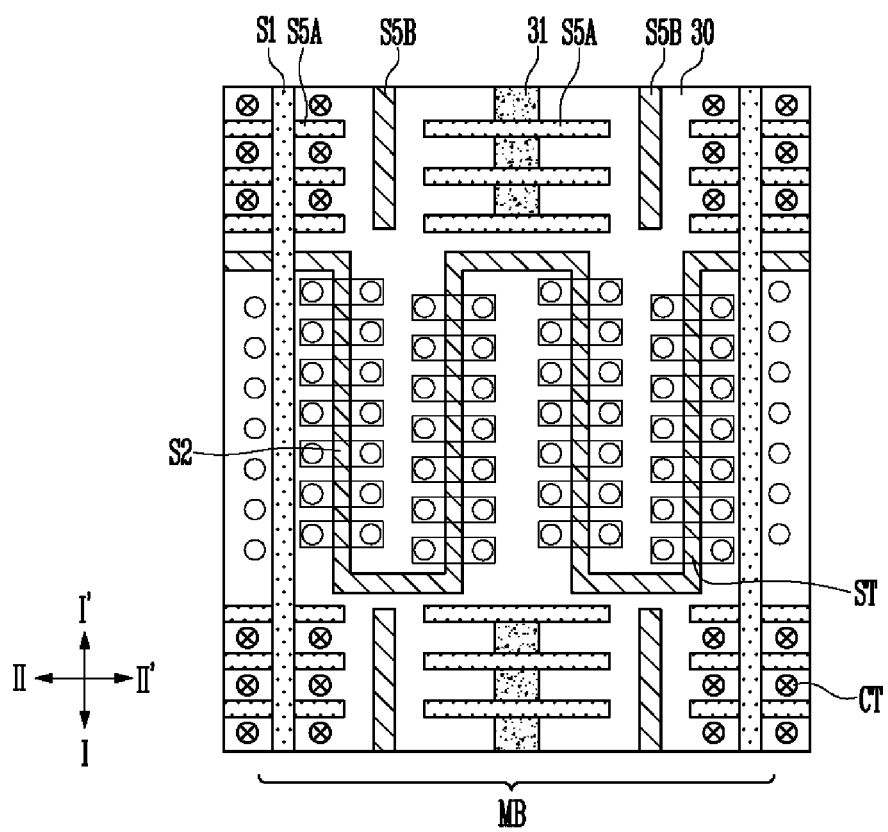
Figure 90:
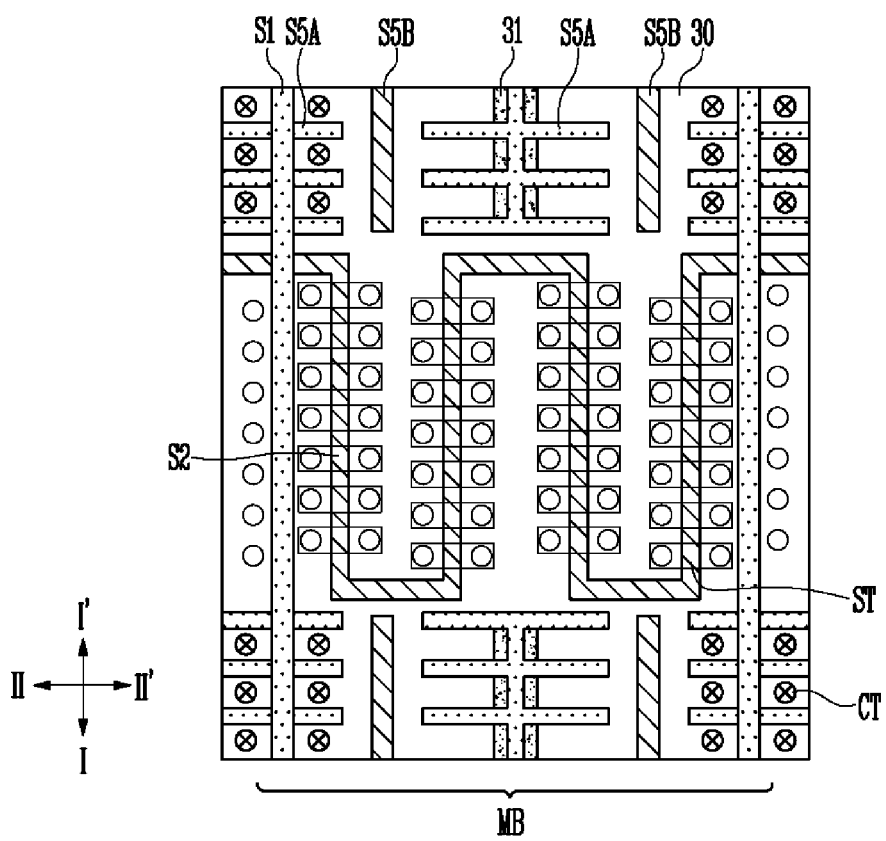

FIG. 9N is a layout diagram of a 3-D non-volatile memory device according to the nineteenth embodiment of this disclosure.

As shown in FIG. 9N, the 3-D non-volatile memory device according to the nineteenth embodiment of this disclosure has a similar layout to that of the eighteenth embodiment, but differs from that of the eighteenth embodiment by where the positions of the contact plugs are formed. In accordance with the nineteenth embodiment, contact plugs CT may be formed generally at the edges of a slimming region.

The slits in the nineteenth embodiment may be formed in the same order as those in the eleventh embodiment.

FIG. 9O is a layout diagram of a 3-D non-volatile memory device according to the twentieth embodiment of this disclosure.

As shown in FIG. 9O, the 3-D non-volatile memory device according to the twentieth embodiment of this disclosure has a similar layout to that of the eighteenth embodiment, but differs from that of the eighteenth embodiment by the shapes created by some of fifth slits S5A. In accordance with the twentieth embodiment, some of the fifth slits S5A have generally a shape in which a first line pattern extends generally in a first direction I-I' and second line patterns generally extend in parallel in a second direction II-II' to generally cross one another. Furthermore, the remaining fifth slits S5A are formed in generally a line form extending generally in the second direction II-II' and are formed to generally cross the boundary of adjacent memory blocks.

Here, he fifth slit S5A having the form in which the first and the second line patterns cross each other may be formed in a primary slit formation process. Accordingly, first material layers may remain near the first line patterns (i.e., see reference numeral '31' of FIG. 9O).

The slits in the twentieth embodiment may be formed in the same order as those in the eleventh embodiment.

Figure 10:
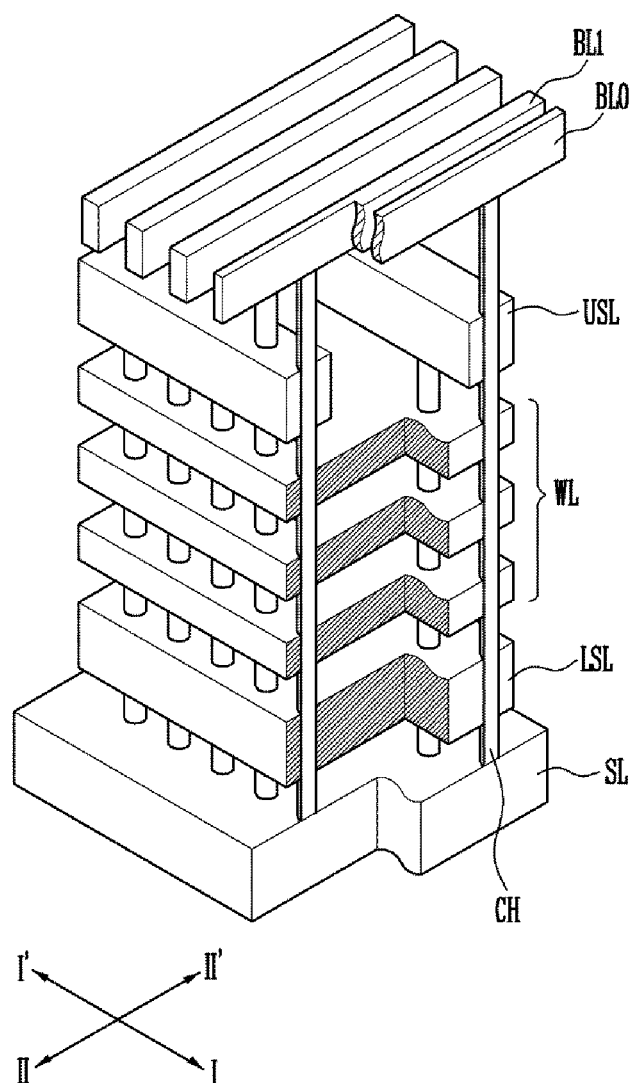
FIG. 10 is a perspective view of a 3-D non-volatile memory device according to twenty-first to twenty-fourth embodiments of this disclosure.

FIG. 10 is a perspective view of a 3-D non-volatile memory device according to twenty-first to twenty-fourth embodiments of this disclosure. It is to be noted that interlayer insulating layers are not shown in FIG. 10, for convenience of description.

As shown in FIG. 10, the 3-D non-volatile memory device according to the twenty-first to twenty-fourth embodiments of this disclosure may have a structure in which a lower select line LSL, a plurality of word lines WL, and an upper select line USL are sequentially stacked substantially over a substrate (not shown) including a source line SL. A plurality of bit lines BL0 and BL1 may be further included generally over the upper select line USL. In FIG. 10, a plurality of memory cells may be stacked along each of a plurality of channels CH substantially protruding from the substrate, thus forming strings vertically arranged from the substrate. Furthermore, one channel row generally extended in a second direction II-II' may be formed in general zigzags and may be coupled to at least two bit lines BL0 and BL1.

Figure 11:
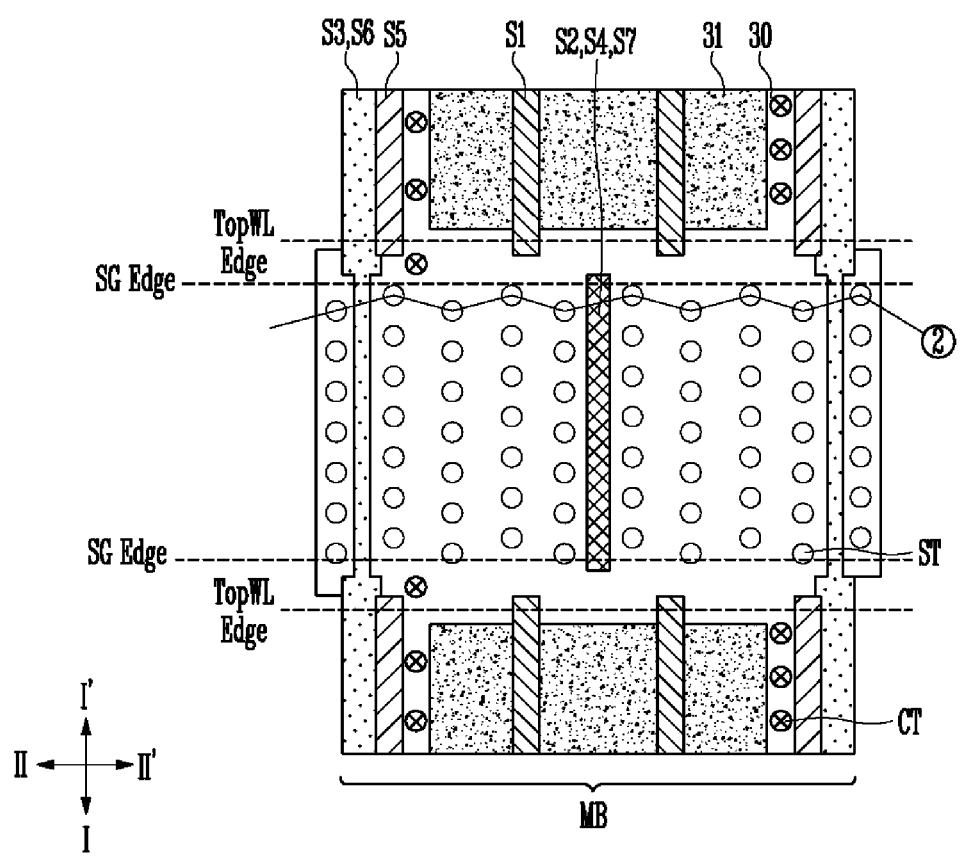
FIG. 11 is a layout diagram of the 3-D non-volatile memory device according to the twenty-first to twenty-fourth embodiments of this disclosure.

FIG. 11 is a layout diagram of the 3-D non-volatile memory device according to the twenty-first to twenty-fourth embodiments of this disclosure. FIG. 11 is the layout diagram of the 3-D non-volatile memory device of FIG. 10.

As shown in FIG. 11, the 3-D non-volatile memory device according to the twenty-first to twenty-fourth embodiments of this disclosure may include one channel row generally extended in the second direction II-II' and formed generally in zigzags (2), and include at least two slits out of the first to seventh slits S1 to S7. In particular, the first to seventh slits S1 to S7 may be combined in various ways, the slits may be formed according to various orders, and some of the slits may be formed generally at the same time.

The first slit S1 mat be placed adjacent to a slimming region. The first slit S1 may be placed within the slimming region, may be placed in the circumference of the slimming region, or may be placed in the inside and circumference of the slimming region. The first slit S1 may include one or more linear slits. The linear slits may be formed both in the upper and lower slimming regions of the slimming region or may be formed in one of the upper or lower slimming regions.

Furthermore, the first slit S1 may be formed in a primary slit formation process or a secondary slit formation process. For example, if the first slit S1 is formed in the primary slit formation process, an insulating layer may be substantially filled, other slits are formed, and sacrificial layers are then substantially recessed, the interlayer insulating layers of the slimming region can be prevented from collapsing when recessing the sacrificial layers. For another example, if the first slit S1 is formed in the secondary slit formation process and the sacrificial layers are generally removed, contact pads may be formed substantially within the slimming region.

The second slit S2, the fourth slit S4, and the seventh slits S7 may be placed between the channels. The second slit S2 and the fourth slit S4 may be formed in different processes. The fourth slit S4 may be formed in the primary slit formation process, and it may function to prevent the remaining interlayer insulating layers from collapsing when recessing the sacrificial layers. The second slit S2 may be formed in the secondary slit formation process and may be used to substantially remove the sacrificial layers.

The seventh slit S7 may be placed between the channels and may be formed to substantially the same depth as the select line SL. The seventh slit S7 may be formed in the primary slit formation process or the secondary slit formation process.

If the 3-D non-volatile memory device includes at least two of the second slit S2, the fourth slit S4, and the seventh slit S7, the slits may be formed at different positions.

The third slit S3 and the sixth slit S6 may be placed between adjacent memory blocks. The third slit S3 and the sixth slit S6 are formed at different positions. The third slit S3 may be formed in the primary slit formation process and may be used to substantially prevent the remaining interlayer insulating layers from collapsing when recessing the sacrificial layers. The sixth slit S6 may be formed in the secondary slit formation process and may be used to substantially remove the sacrificial layers. If the 3-D non-volatile memory device includes both the third slit S3 and the sixth slit S6, the third slit S3 and the sixth slit S6 are formed at generally different positions.

The fifth slit S5 may be placed generally between the third slit S3 and a slimming region. For example, if the third slit S3 is formed in the primary slit formation process and an insulating layer is then filled, the fifth slit S5 may be formed in the secondary slit formation process and the contact pads may be formed on both sides of the slimming region by removing the sacrificial layers on both sides of the slimming region. The fifth slit S5 may partially overlap with the third slit S3.

Figure 12:
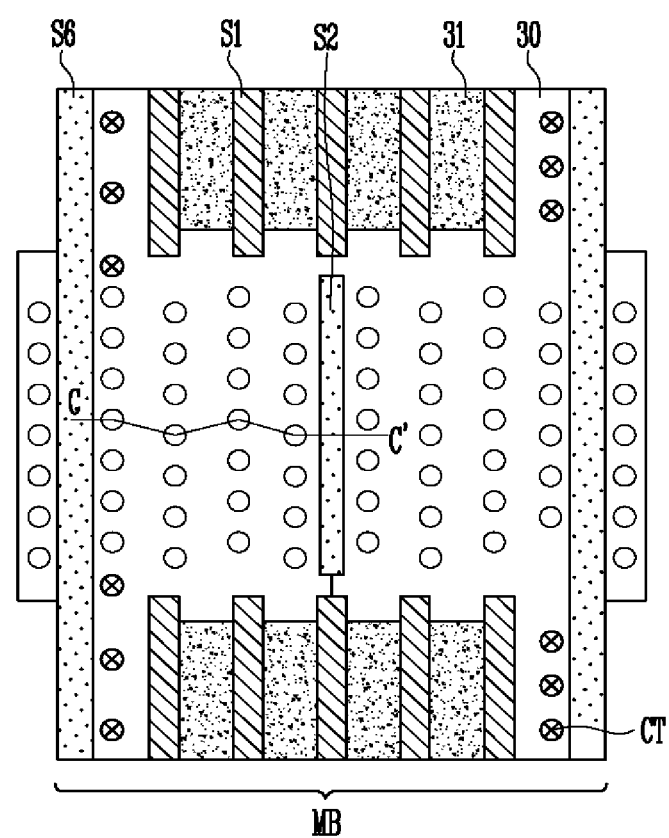
FIG. 12 is a layout diagram of a 3-D non-volatile memory device according to the twenty-first embodiment of this disclosure.

FIG. 12 is a layout diagram of a 3-D non-volatile memory device according to the twenty-first embodiment of this disclosure.

As shown in FIG. 12, the 3-D non-volatile memory device according to the twenty-first embodiment of this disclosure includes at least one first slit S1 placed generally within a slimming region, at least one second slit S2 placed generally between the channels, and a sixth slit S6 placed generally between adjacent memory blocks MB.

Figure 13A:
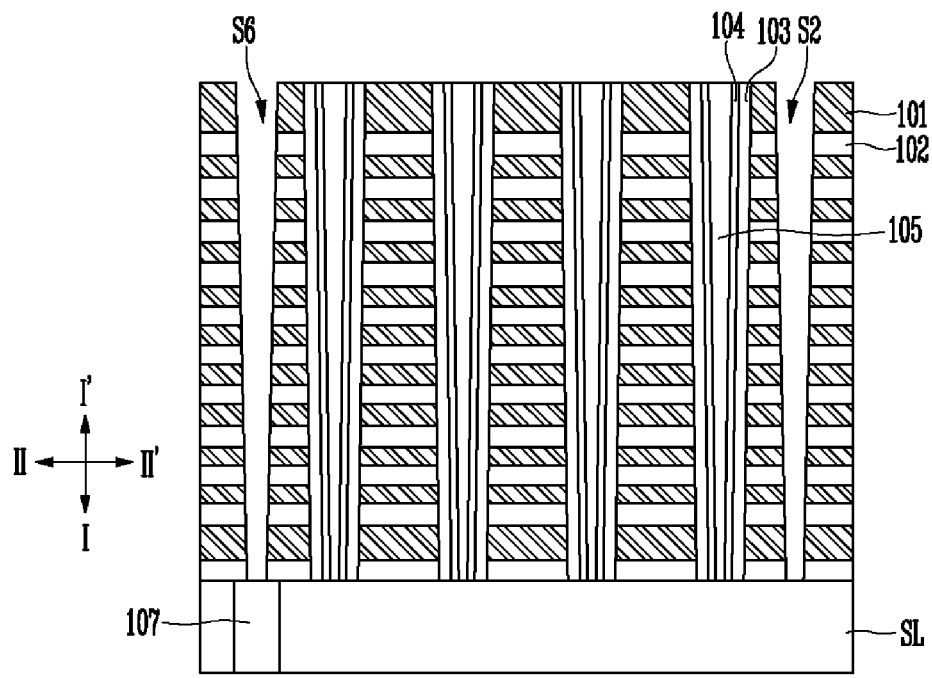
FIGS. 13A and 13B are cross-sectional views illustrating a method of manufacturing the 3-D non-volatile memory device according to the twenty-first embodiment of this disclosure.
Figure 13B:
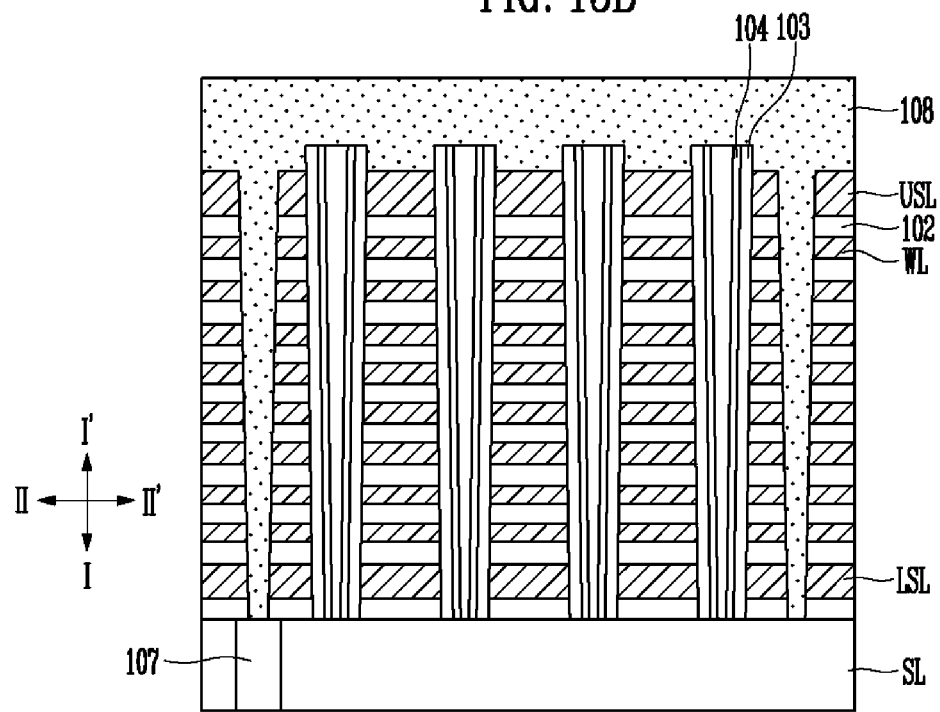

FIGS. 13A and 13B are cross-sectional views illustrating a method of manufacturing the 3-D non-volatile memory device according to the twenty-second embodiment of this disclosure. FIGS. 13A and 13B show the cross-sectional views of the 3-D non-volatile memory device taken along line C-C' of FIG. 12. A description of the contents of the sixteenth embodiment that are redundant with the contents of the previous embodiments is omitted for simplicity.

As shown in FIG. 13A, first material layers 101 and second material layers 102 are alternately formed over a substrate (not shown) including the source lines SL separated from each other with an insulating layer 107 interposed therebetween. At least one first material layer 101 forming the lowest layer may be used to form the lower select line LSL (i.e., see FIG. 13B), and at least one first material layer 101 forming the highest layer may be used to form the upper select line USL (i.e., see FIG. 13B), and the remaining first material layers 101 may be used to form the word lines WL. Each of the first material layers 101 for the lower and upper select lines LSL and USL may generally be thicker than each of the first material layers 101 for the word lines WL.

In the twenty-second embodiment, it may be assumed that the first material layer 101 is formed substantially of a sacrificial layer and the second material layer 102 is substantially formed of an interlayer insulating layer.

The first material layers 101 and the second material layers 102 may be etched to form a plurality of trenches.

A memory layer 103 may be formed generally on the insides of the multipletrenches. The channels CH protruding from the substrate may be formed by forming a channel layer 104 generally on the memory layer 103.

At least one first slit S1 placed in the slimming region may be formed by etching the first material layers 101 and the second material layers 102. Next, the insulating layer may be substantially filled in at least one first slit S1. The position of the first slit S1 is not shown.

Next, the first material layers 101 and the second material layers 102 may be etched to form at least one second slit S2 placed substantially between the channels CH. At this time, the plurality of sixth slits S6 placed between adjacent memory blocks may be formed.

As shown in FIG. 13B, a lower select line region, a plurality of word line regions, and an upper select line region may be formed by recessing the first material layers 101 exposed to the plurality of sixth slits S6 and at least one second slit S2

The lower select line LSL, the plurality of word lines WL, and the upper select line USL may be formed by substantially filling a conductive layer in the lower select line region, the multiple word line regions, and the upper select line region.

An insulating layer 108 may be formed on and after the lower select line LSL, the multiple word lines WL, and the upper select line USL are formed, thereby substantially filling the multiple sixth slits S6 and at least one second slit S2.

For reference, processes after forming the second slit S2 and the sixth slits S6 may be different depending on the types of the first material layer 101 and the second material layer 102.

Figure 14A:
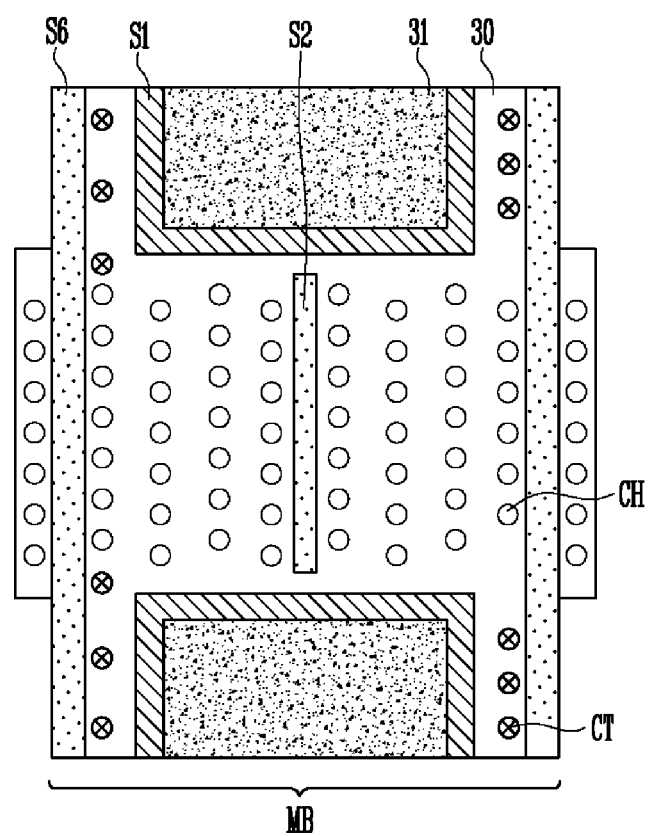
FIGS. 14A to 14C are layout diagrams of the 3-D non-volatile memory device according to the twenty-second to twenty-fourth embodiment of this disclosure.

FIG. 14A is a layout diagram of the 3-D non-volatile memory device according to the twenty-second embodiment of this disclosure.

As shown in FIG. 14A, the 3-D non-volatile memory device according to the twenty-second embodiment of this disclosure may include at least one first slit S1 placed generally in the circumference of a slimming region, multiple sixth slits S6 placed generally between memory blocks MB, and at least one second slit S2 placed between the channels CH. In particular, the first slit S1 may generally have a 'ㄷ' shape so that it may be placed in the circumference of the slimming region.

In the twenty-second embodiment, after forming the first slit S1 in a primary slit formation process, an insulating layer may be substantially filled. Next, after forming the sixth slits S6 and the second slit S2 in a secondary slit formation process, sacrificial layers may be substantially recessed. In this case, interlayer insulating layers generally surrounded by the insulating layer filled in at least one first slit S1 may not be recessed, and contact pads may be substantially formed on both sides of the slimming region through the sixth slits S6.

Figure 14B:
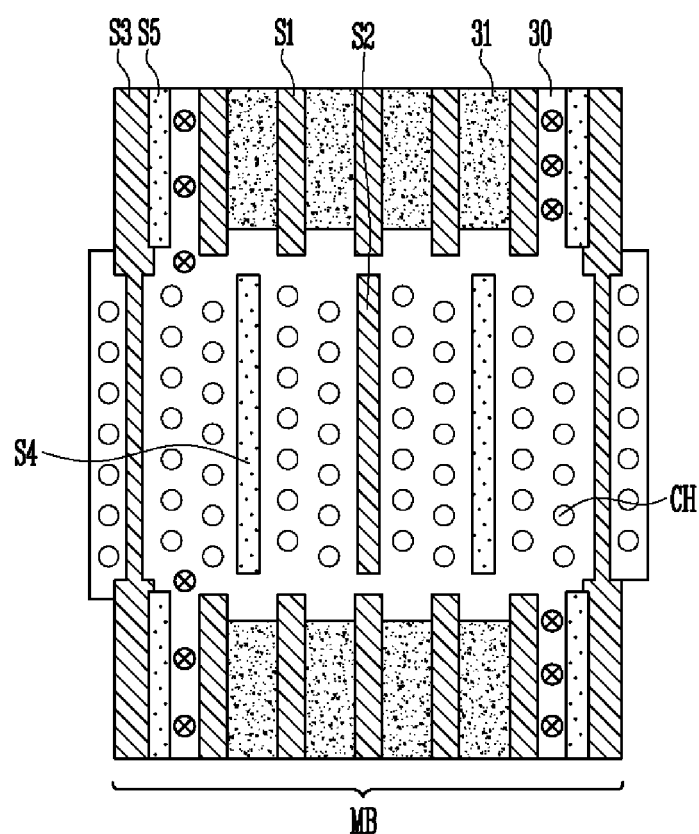

FIG. 14B is a layout diagram of the 3-D non-volatile memory device according to the twenty-third embodiment of this disclosure.

As shown in FIG. 14B, the 3-D non-volatile memory device according to the twenty-third embodiment of this disclosure may include at least one first slit S1 placed generally within a slimming region, at least one second slit S2 and at least one fourth slit S4 placed generally between the channels CH, a plurality of third slits S3 placed generally between adjacent memory blocks MB, and a fifth slit S5 placed generally between the third slits S3 and the slimming region.

In the seventeenth embodiment, after forming the first slit S1, the third slits S3, and the fourth slit S4 in a primary slit formation process, an insulating layer may be substantially filled. Next, after forming the second slit S2 and the fifth slit S5 in a secondary slit formation process, sacrificial layers may be substantially recessed. In this case, the insulating layer filled in the first slit S1, the third slits S3, and the fourth slit S4 may effectively prevent the remaining interlayer insulating layers from collapsing when removing the sacrificial layers.

Figure 14C:
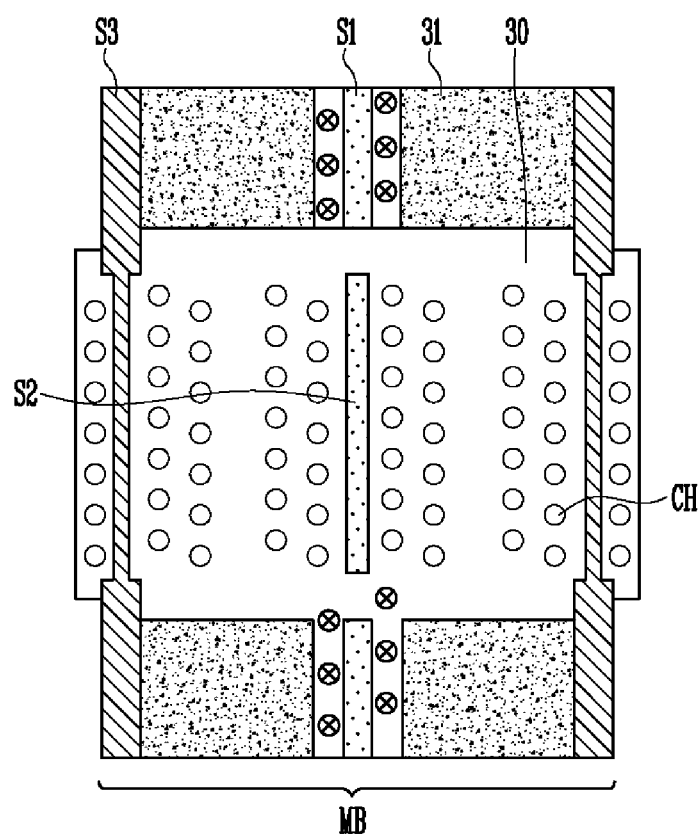

FIG. 14C is a layout diagram of the 3-D non-volatile memory device according to the twenty-fourth embodiment of this disclosure.

As shown in FIG. 14C, the 3-D non-volatile memory device according to the twenty-fourth embodiment of this disclosure includes at least one first slit S1 placed generally within a slimming region, a plurality of third slits S3 placed generally between adjacent memory blocks MB, and at least one second slit S2 placed generally between the channels CH.

In the eighteenth embodiment, after forming the third slits S3 in a primary slit formation process, an insulating layer may be substantially filled. Next, after forming the first slit S1 and the second slit S2 in a secondary slit formation process, sacrificial layers may be substantially recessed. In this case, contact pads may be formed within the slimming region through the first slit S1.

Figure 15:
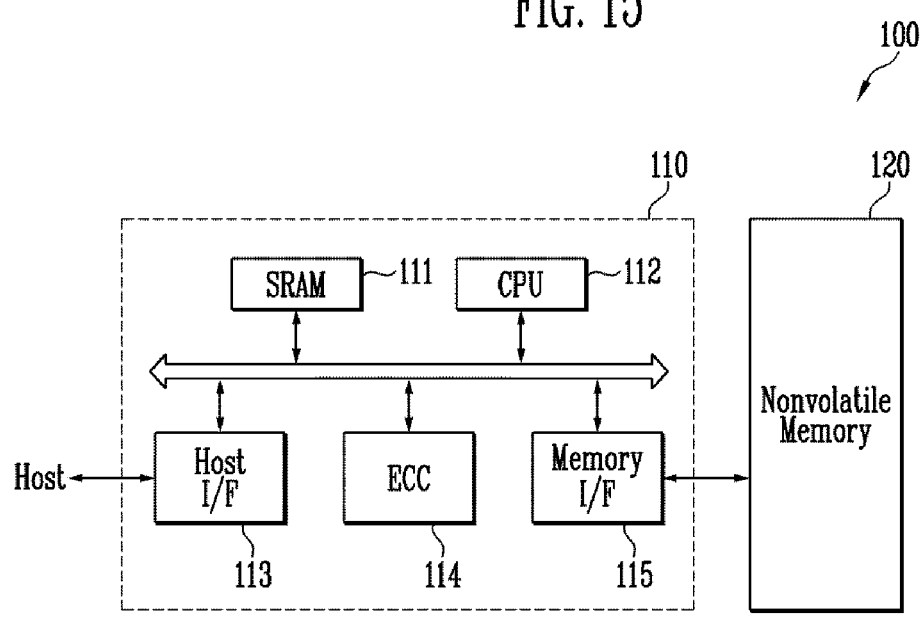
FIG. 15 Illustrates the construction of a memory system according to an embodiment of this disclosure.

FIG. 15 shows the construction of a memory system according to an example of an embodiment of this disclosure.

As shown in FIG. 15, the memory system 100 according to the embodiment of this disclosure may include a non-volatile memory device 120 and a memory controller 110.

The non-volatile memory device 120 may be configured to include the slits according to the first to twenty-fourth embodiments of this disclosure. In some embodiments, the non-volatile memory device 120 may be a multi-chip package including a plurality of flash memory chips.

The memory controller 110 controls the non-volatile memory device 120 and may include SRAM 111, a Central Processing Unit (CPU) 112, a host interface (I/F) 113, an ECC circuit 114, and a memory I/F 115. The SRAM 111 may be used as the operating memory of the CPU 112. The CPU 112 may perform an overall control operation for the data exchange of the memory controller 110. The host I/F 113 may be equipped with the data exchange protocol of a host coupled to the memory system 100. Furthermore, the ECC circuit 114 may detect and correct errors included in data read out from the non-volatile memory device 120. The memory I/F 115 may perform an interface with the non-volatile memory device 120. The memory controller 110 may further include RCM for storing code data for an interface with the host.

The memory system 100 constructed as above may be a memory card or a Solid State Disk (SSD) in which the non-volatile memory device 120 and the controller 110 are combined. For example, if the memory system 100 is an SSD, the memory controller 110 may communicate with the outside (e.g., a host) through one of various interface protocols, such as USB, MMC, PCI-E, SATA, PATA, SCSI, ESDI, and IDE, etc.

Figure 16:
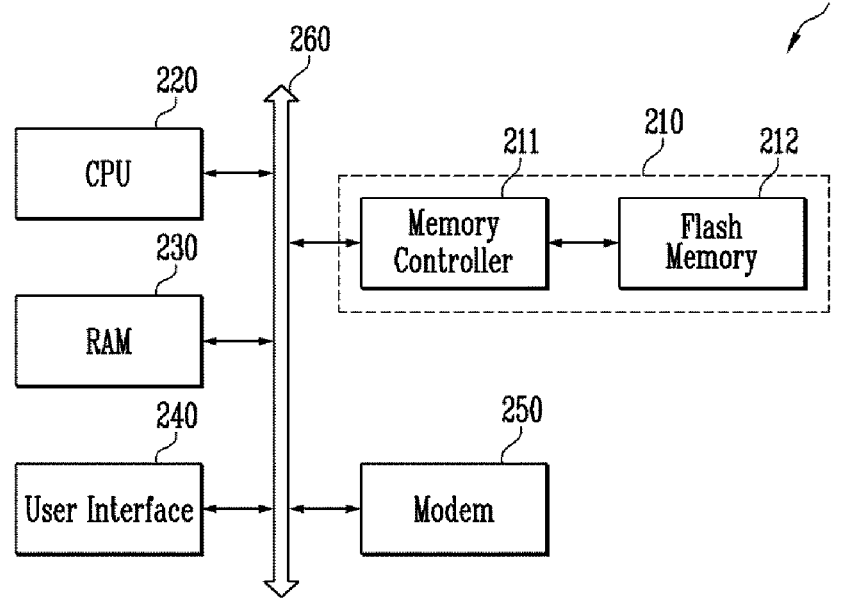
FIG. 16 Illustrates the construction of a computing system according to an embodiment of this disclosure.

FIG. 16 shows the construction of a computing system according to an embodiment of this disclosure.

As shown in FIG. 16, the computing system 200 according to the embodiment of this disclosure may include a CPU 220, RAM 230, a user interface 240, a modem 250, and a memory system 210 electrically coupled to a system bus 260. If the computing system 200 is a mobile device, the computing system 200 may further include a battery for supplying operating voltages to the computing system 200. The computing system 200 may further include application chipsets, a Camera Image Processor (CIS), mobile DRAM, and so on.

The memory system 210 may include a non-volatile memory device 212 and a memory controller 211, such as those described above with reference to FIG. 15.

Meanwhile, in this specification, the shapes of the slits and order that the slits are formed according to the arrangements of the strings formed in the cell region have been described. However, they are only embodiments for convenience of description, and the present disclosure is not limited to the embodiments. Particularly, the shapes of the slits formed in the slimming region in this specification are not limited to those described in the above-described embodiments, and the present disclosure may include slits having combinations of the shapes or slits of various shapes modified with reference to the shapes. Furthermore, the semiconductor device according to the embodiment of this disclosure may include slits of various shapes which are proposed in this specification irrespective of the arrangements of the strings. For example, when the strings are arranged in a vertical form, the fifth slits of various shapes proposed in connection with the sixth to twentieth embodiments may be included in the slimming region.

As described above, in accordance with this disclosure, stack structures included in a semiconductor device can be prevented from inclining or collapsing.

What is claimed is:

1. A semiconductor device, comprising:
   memory blocks each configured to comprise a pipe gate and channels, each channel including a pipe channel formed in the pipe gate and a pair of a drain-side channel and a source-side channel coupled to the pipe channel;
   insulating layers placed between the memory blocks adjacent to other memory blocks, and interposed between pipe gates of the memory blocks to insulate the pipe gates from each other;
   first slits placed between the memory blocks adjacent to other memory blocks and placed above the insulating layers; and
   a second slit placed between the source-side channel and the drain-side channel of each pair of channels;
   third slits placed between the drain-side channels adjacent to other drain-side channels and formed to generally the same depth as drain select lines, wherein the drain select lines of the drain-side channels adjacent to other drain-side channels are separated from each other by the third slits interposed therebetween, and the drain-side channels adjacent to each other share a drain-side word line; and
   fourth slits placed between the source-side channels adjacent to other source-side channels and formed to generally the same depth as source select lines, wherein the source select lines of the source-side channels adjacent to other source-side channels are separated from each other by the fourth slits interposed therebetween, and the source-side channels adjacent to each other share a source-side word line.

2. The semiconductor device of claim 1, wherein the channels arranged in one direction form each of a channel row, and the channel row arranged generally in a zigzag and coupled to at least two bit lines.

3. The semiconductor device of claim 1, wherein the first slits are located over the insulating layers.

4. The semiconductor device of claim 1, wherein each of the first slits overlaps each of the insulating layers.

5. A semiconductor device, comprising:
   memory blocks each configured to comprise a pipe gate and channels, each channel including a pipe channel formed in the pipe gate and a pair of a drain-side channel and a source-side channel coupled to the pipe channel;
   insulating layers placed between the memory blocks adjacent to other memory blocks, and interposed between pipe gates of the memory blocks to insulate the pipe gates from each other;
   first slits placed between the memory blocks adjacent to other memory blocks and placed above the insulating layers;
   a second slit placed between the source-side channel and the drain-side channel of each pair of channels;
   third slits placed between the drain-side channels adjacent to other drain-side channels, wherein a drain-side word line and a drain select line of the drain-side channels adjacent to other drain-side channels are separated from each other by the third slits interposed therebetween; and fourth slits placed between the source-side channels adjacent to other source-side channels and formed to generally the same depth as source select lines, wherein the source select lines of the source-side channels adjacent to other source-side channels are separated from each other by the fourth slits interposed therebetween and the source-side channels adjacent to each other share a source-side word line.

6. A semiconductor device, comprising:
memory blocks each configured to comprise a pipe gate and channels, each channel including a pipe channel formed in the pipe gate and a pair of a drain-side channel and a source-side channel coupled to the pipe channel;
insulating layers placed between the memory blocks adjacent to other memory blocks, and interposed between the pipe gates of the memory blocks to insulate the pipe gates from each other;
first slits placed between the memory blocks adjacent to other memory blocks and placed above the insulating layers;
a second slit placed between the source-side channel and the drain-side channel of each pair of channels;
third slits placed between the source-side channels adjacent to other source-side channels, wherein a source-side word line and a source select line of the adjacent channels are separated from each other by the third slits interposed therebetween; and
fourth slits placed between the drain-side channels adjacent to other drain-side channels and formed to generally the same depth as drain select lines, wherein the drain select lines of the drain-side channels adjacent to other drain-side channels are separated from each other by the fourth slits interposed therebetween,
wherein the drain-side channels adjacent to each other share a drain-side word line.

7. A semiconductor device, comprising:
memory blocks each configured to comprise a pipe gate and channels, each channel including a pipe channel formed in the pipe gate and a pair of a drain-side channel and a source-side channel coupled to the pipe channel;
insulating layers placed between the memory blocks adjacent to other memory blocks, and interposed between the pipe gates of the memory blocks to insulate the pipe gates from each other;
first slits placed between the memory blocks adjacent to other memory blocks and placed above the insulating layers;
a second slit placed between the source-side channel and the drain-side channel of each pair of channels; and
at least one fifth slit placed substantially within a slimming region of the memory block, generally in a circumference of the slimming region, or substantially within the slimming region and generally in the circumference of the slimming region, wherein the memory block includes a cell region where the channels are located and the slimming region located at both sides of the cell region.

8. The semiconductor device of claim 7, further comprising at least one of first contact pads formed generally at edges on both sides of the slimming region and second contact pads formed generally within the slimming region.

9. The semiconductor device of claim 7, wherein the at least one fifth slit is formed generally within the slimming region of the memory block and configured to generally have a line form extended in parallel in one direction.

10. The semiconductor device of claim 7, wherein the at least one fifth slit is formed generally within the slimming region of the memory block and configured to generally have a line form including protruding parts.

11. The semiconductor device of claim 7, wherein the at least one fifth slit is placed generally within the slimming region of the memory block and each configured to include a first line pattern generally extended in a first direction and second line patterns generally extended in parallel in a second direction substantially crossing the first direction.

12. The semiconductor device of claim 7, wherein the at least one fifth slit is placed generally within the slimming region of the memory block and configured to generally have a line form substantially crossing a boundary of the adjacent memory blocks.

13. The semiconductor device of claim 7, wherein the at least one fifth slit is placed substantially between one of the first slits and a slimming region.

14. A semiconductor device, comprising:
a substrate including a source line therein;
memory blocks each configured to include channels coupled to the source line and protruded from the substrate, wherein each of the memory blocks includes a cell region where the channels are located and a slimming region located at both sides of the cell region, and the cell region and the slimming region are arranged in a direction parallel to a surface of the substrate;
at least one first slit placed in the slimming region of the memory block;
at least one second slit formed in the cell region of the memory block and placed between the channels; and
third slits placed between the memory blocks adjacent to each other.

15. The semiconductor device of claim 14, further comprising fourth slits placed between the third slits and the slimming region.

16. The semiconductor device of claim 14, wherein the first slit is formed substantially within the slimming region, generally in an circumference of the slimming region, or substantially within the slimming region and generally in the circumference of the slimming region.

17. The semiconductor device of claim 14, wherein the first slits are placed within the slimming region of the memory block and are configured to generally have line forms extended generally in parallel.

18. The semiconductor device of claim 14, wherein the first slit is placed substantially within the slimming region of the memory block and is configured to generally have a line form including a protruding part.

19. The semiconductor device of claim 14, wherein the first slits are placed substantially within the slimming region of the memory block and are configured to have a form in which a first line pattern extended in a first direction and second line patterns extended generally in parallel in a second direction to substantially cross the first direction crossing each other.

20. The semiconductor device of claim 14, wherein the first slit is placed substantially within the slimming region of the memory block and is configured to generally have a line form substantially crossing a boundary of the memory blocks adjacent to each other.

21. The semiconductor device of claim 14, further comprising at least one of first contact pads formed generally at edges on both sides of the slimming region and second contact pads formed substantially within the slimming region.

22. The semiconductor device of claim 14, further comprising at least one fifth slit placed between the channels and formed to generally the same depth with a select line.

23. The semiconductor device of claim 14, wherein the channels arranged in one direction form each of a channel row, and the channel row is arranged generally in a zigzag and coupled to at least two bit lines.

24. The semiconductor device of claim 14, wherein each of the memory blocks includes word lines stacked in the cell region and contact pads arranged in the slimming region and coupled to the word lines.

25. The semiconductor device of claim 14, wherein bottom surfaces of the channels are coupled to the source line.

26. The semiconductor device of claim 14, further comprising insulating layers placed between the memory blocks adjacent to each other, and interposed between source lines of the memory blocks to insulate the source lines from each other, wherein the third slits are located over the insulating layers.

* * * * *